(12) United States Patent
de Rochemont

(10) Patent No.: US 11,387,043 B2
(45) Date of Patent: Jul. 12, 2022

(54) HIGH ENERGY DENSITY DIELECTRIC LAYER

(71) Applicant: L. Pierre de Rochemont, Raleigh, NC (US)

(72) Inventor: L. Pierre de Rochemont, Raleigh, NC (US)

( * ) Notice: Subject to any disclaimer, the term of this patent is extended or adjusted under 35 U.S.C. 154(b) by 85 days.

(21) Appl. No.: 16/870,226

(22) Filed: May 8, 2020

(65) Prior Publication Data
US 2021/0175014 A1 Jun. 10, 2021

Related U.S. Application Data

(63) Continuation of application No. 15/958,706, filed on Apr. 20, 2018, now Pat. No. 10,650,967.

(60) Provisional application No. 62/487,957, filed on Apr. 20, 2017.

(51) Int. Cl.
| | |
|---|---|
| *H01G 4/12* | (2006.01) |
| *H01G 4/012* | (2006.01) |
| *H01L 49/02* | (2006.01) |
| *H01G 4/30* | (2006.01) |
| *B82Y 30/00* | (2011.01) |

(52) U.S. Cl.
CPC ........... *H01G 4/1209* (2013.01); *H01G 4/012* (2013.01); *H01G 4/1227* (2013.01); *H01G 4/30* (2013.01); *H01L 28/55* (2013.01); *B82Y 30/00* (2013.01)

(58) Field of Classification Search
None
See application file for complete search history.

(56) References Cited

U.S. PATENT DOCUMENTS

| | | | |
|---|---|---|---|
| 4,395,472 A | 7/1983 | Robillard | |
| 4,399,321 A | 8/1983 | Gotilieb | |
| 5,638,260 A | 6/1997 | Bees | |
| 6,028,872 A | 2/2000 | Partlo et al. | |
| 6,266,230 B1 | 7/2001 | Kato et al. | |
| 7,161,795 B1* | 1/2007 | Megherhi | ............ C04B 35/462 |
| | | | 361/321.5 |
| 7,602,102 B1 | 10/2009 | Barber et al. | |
| 10,504,843 B2* | 12/2019 | de Rochemont | ... H01L 25/0657 |
| 10,650,967 B2* | 5/2020 | de Rochemont | ....... H01L 28/55 |
| 2001/0038087 A1 | 11/2001 | Santilli | |

(Continued)

FOREIGN PATENT DOCUMENTS

| | | | |
|---|---|---|---|
| KR | 20200133410 A | * 11/2020 | |
| WO | WO-2018204487 A1 | * 11/2018 | ......... H01L 23/5329 |
| WO | WO-2019236734 A1 | * 12/2019 | ......... H01L 23/5383 |

OTHER PUBLICATIONS

International Search Report and the Written Opinion dated Aug. 24, 2018, for International Application No. PCT/US2018/028613 International Filing Date Apr. 20, 2018.

*Primary Examiner* — Dion R. Ferguson
(74) *Attorney, Agent, or Firm* — Burns & Levinson LLP; Jerry Cohen

(57) ABSTRACT

A high energy density dielectric layer having relative dielectric permittivity greater than $\varepsilon_R \geq 70$ and thickness less than 1 micron that when formed between a primary electrode and the secondary electrode of a capacitor, wherein the high energy density dielectric has a dielectric polarization response that is determined solely by orbital deformations of the atomic species forming said high energy density dielectric.

14 Claims, 25 Drawing Sheets

(56) References Cited

U.S. PATENT DOCUMENTS

| | | |
|---|---|---|
| 2003/0011960 A1 | 1/2003 | Koning et al. |
| 2010/0072581 A1 | 3/2010 | Nakasaki et al. |
| 2014/0185187 A1 | 7/2014 | Bai |
| 2014/0295101 A1 | 10/2014 | Carver |
| 2015/0295244 A1 | 10/2015 | Otsuka et al. |
| 2016/0111227 A1 | 4/2016 | Asay et al. |
| 2016/0111727 A1 | 4/2016 | Li et al. |
| 2016/0351330 A1 | 12/2016 | Gong et al. |
| 2018/0308636 A1* | 10/2018 | de Rochemont ....... H01L 28/55 |
| 2021/0175014 A1* | 6/2021 | de Rochemont ....... H01L 28/55 |

* cited by examiner

SIDE VIEW

PERSPECTIVE VIEW

TABLE 1

Transition Metal Elements

| Symbol | Sc | Ti | V | Cr | Mn | Zn | Y | Zr | Nb | Mo | Hf | Ta | W |
|---|---|---|---|---|---|---|---|---|---|---|---|---|---|
| amu | 21 | 22 | 41 | 42 | 25 | 30 | 38 | 40 | 41 | 42 | 72 | 73 | 74 |

Lanthanide Metal Elements

| Symbol | La | Ce | Pr | Nd | Sm | Eu | Gd | Tb | Dy | Ho | Yb |
|---|---|---|---|---|---|---|---|---|---|---|---|
| amu | 57 | 58 | 59 | 60 | 62 | 63 | 64 | 64 | 66 | 67 | 70 |

Post Transition Metal Elements

| Symbol | In | Sn | Pb | Bi |
|---|---|---|---|---|
| amu | 49 | 50 | 82 | 83 |

FIG. 2E

PERSPECTIVE VIEW

PERSPECTIVE VIEW

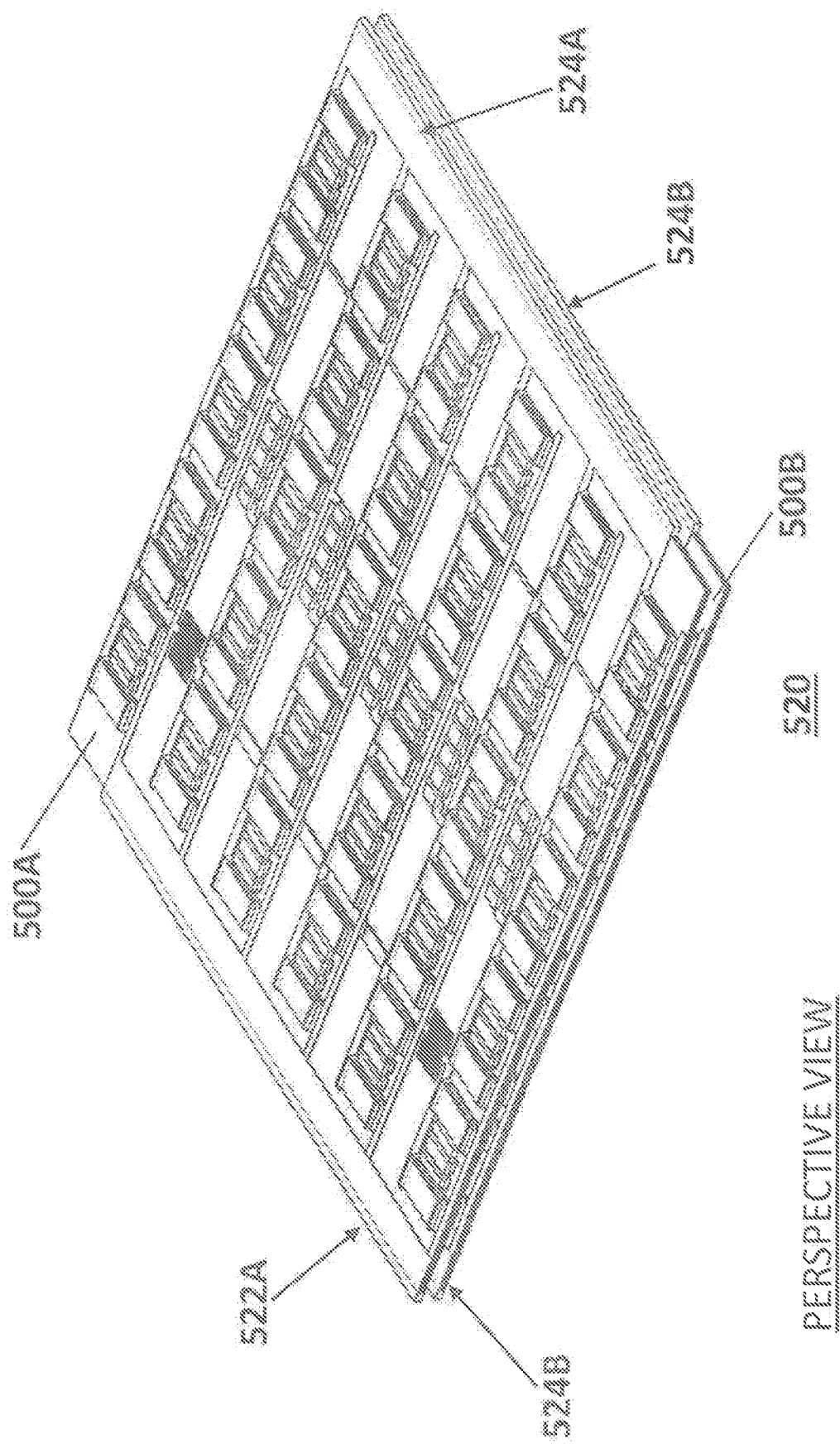

HIGH ENERGY DENSITY DIELECTRIC LAYER

CROSS REFERENCE TO RELATED APPLICATIONS

This application is a continuation application of U.S. application Ser. No. 15/958,706, filed Apr. 20, 2018, which claims priority from U.S. Provisional Patent Application No. 62/487,957, filed Apr. 20, 2017 and the contents of these application are incorporated herein by reference in their entirety, as though set out at length herein.

FIELD OF THE INVENTION

The present invention relates generally to a high energy density dielectric layer and the design and construction of an energy storage device that comprises high energy density capacitors incorporating one or more of such high energy density dielectric layers configured in parallel within a three dimensional (3D) array that includes embedded passive circuitry, wherein the embedded passive circuitry tunes the 3D high energy density capacitor array to be resonant at frequencies that enable the energy storage devices to be energized and/or de-energized at desirable charge and discharge rates.

The present invention further relates to application of these energy storage devices in conjunction with electrical storage devices, such as batteries, to improve the charge time of vehicles that are powered with hybrid or electrical engines or motors used in automotive, aviation, and other work producing systems.

The present invention generally relates to methods to fabricate the energy storage device and components thereby including said high energy dielectric layer.

1. Background to the Invention

Improved fuel efficiencies are achieved in hybrid and all-electric engines. Electrical motors produce high torque more easily than gasoline combustion engines, which efficiently deliver high horsepower at higher speeds. Hybrid engines, particularly those used in automotive racing, optimally provide high torque while accelerating from a stop or at low speed while accelerating from a stop or at low speed from the engines' electrical component and higher horsepower at speeds where combustion engines provide optimal performance. There is a desire to apply these efficiencies in aviation markets as improved aircraft fuel efficiency and range lowers operational costs to the airline industry. Longer range aircraft are more economically efficient to operate. They have weight at takeoff attributable to the fuel needed to travel over the longer range. Since a great deal of fuel is expended at takeoff, it is desirable preserve that fuel for longer range flight by generating takeoff thrust electrically. In instances, automotive or aviation, light weight, low volume, high energy density electrical storage devices, such as capacitors, are desirable.

2. Overview of the Related Art

Ultra-capacitors are frequently discussed as a potential storage device for their high energy storage potential, but these systems are typically limited to operating at voltages of 3V or less. Therefore, it is desirable to produce a storage device formed from robust materials that are capable of operating at high voltage (>100V), preferably in excess of 600V and even at kilovolt voltages.

3. Definition of Terms

The term "average amu" is herein understood to mean the median atomic mass of a unit cell for a crystalline compound derived by summing the fractional atomic mass units contributed by elements form the crystal lattice.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "critical performance tolerances" is herein understood to refer to the ability for all passive components in an electrical circuit to hold performance values within ±1% of the desired values at all operating temperatures over which the circuit was designed to function.

The term "electroceramic" is herein understood to refer to its conventional meaning as being a complex ceramic material that has robust dielectric properties that augment the field densities of applied electrical or magnetic stimulus.

The term "integrated circuit" is herein understood to mean a semiconductor chip into which a large, very large, or ultra-large number of transistor elements have been embedded.

The term "LCD" is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The term "passive component" is herein understood to refer to its conventional definition as an element of an electrical circuit that that modulates the phase or amplitude of an electrical signal without producing power gain.

The term "resonant gate transistor" is herein understood to refer to any of the transistor architectures disclosed in de Rochemont, U.S. Ser. No. 13/216,192, "POWER FET WITH A RESONANT TRANSISTOR GATE", wherein the transistor switching speed is not limited by the capacitance of the transistor gate, but operates at frequencies that cause the gate capacitance to resonate with inductive elements embedded within the gate structure.

The term "standard operating temperatures" is herein understood to mean the range of temperatures between −40° C. and +125° C.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The term "thermomechanical" is herein understood to refer to its conventional definition as relating to properties induced or created by the simultaneous application of elevated temperature and mechanical force or pressure.

The terms "tight tolerance" or "critical tolerance" are herein understood to mean a performance value, such as a capacitance, inductance, or resistance that varies less than ±1% over standard operating temperatures.

The term "II-VI compound semiconductor" is herein understood to refer to its conventional meaning describing a compound semiconductor comprising at least one element from column IIB of the periodic table including: zinc (Zn), cadmium (Cd), or mercury (Hg); and, at least one element from column VI of the periodic table consisting of: oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table including: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table including: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table including: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

The present invention generally relates a high energy density dielectric layer and with a dielectric organization response that is determined by orbital deformations of the atomic species forming it to a multilayer storage capacitor incorporating on or more of such layers. One embodiment of the present invention provides means to embed high dielectric density electroceramics within the multilayer storage capacitor. An additional embodiment pertains to a resonant high energy storage device that comprises at least one inductor coil, configured in series or in parallel, with the multilayer storage capacitor that is optionally configured in parallel with one or more additional multilayer storage capacitors, wherein the resonant high energy storage device charges and discharges at a desired rate. A further embodiment configures the multiple resonant high energy storage devices as a resonant planar array electrically connected in parallel to increase capacitance. An additional further embodiment vertically configures resonant planar arrays electrically connected in parallel into a three-dimensional array to further increase capacitance. Another embodiment configures the multilayer storage capacitor as a decoupling capacitor. A supplementary embodiment configures a multilayer storage capacitor, a resonant planar array, or the three-dimensional planar array in electrical communication with a power management module further comprising a resonant gate transistor.

One embodiment of the present invention provides a multilayer electrical storage capacitor comprising a primary and a secondary electrode in electrical communication with output and input bus electrodes, wherein: the primary electrode is in electrical communication with a primary conducting layer having thickness in the range of 20 nm to 100 micron; the secondary electrode is in electrical communication with a secondary conducting layer having thickness in the range of 20 nm to 1 micron; a high energy density dielectric layer having relative dielectric permittivity greater than $\varepsilon_R \geq 70$ and thickness less than 1 micron that is formed between said primary electrode and said secondary electrode; where further, the high energy density dielectric has a dielectric polarization response that is determined by orbital deformations of the atomic species forming said high energy density dielectric.

The capacitor may have a high dielectric breakdown material that insulates the primary electrode from the secondary electrode at locations in the multilayer electrical storage capacitor where primary electrode and secondary electrode are found in proximity closer than 100 micron. The high dielectric breakdown material may be amorphous silica. The high energy density dielectric layer may comprise a perovskite ceramic further comprising transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric layer may comprise a perovskite ceramic further comprising lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high energy density dielectric may comprise a perovskite ceramic further comprising post transition metal elements from the group consisting of: indium (In), tin (Sn), lead (Pb), and bismuth (Bi). The high energy density dielectric layer may have a relative dielectric permittivity, $\varepsilon_R$, greater than 200. The high energy density dielectric layer may comprise a perovskite ceramic that is compositionally complex. The high energy density dielectric layer may be theoretically dense and may further comprise a polycrystalline network of uniformly distributed grains having uniform grain size less than or equal to 50 nm. The uniformly distributed grains may further comprise a grain core and a grain boundary material that consists essentially of highly electrically insulating metal oxide phases formed with silicon dioxide. The crystalline lattice within the high energy density dielectric layer may have an average atomic mass unit (amu) greater than or equal to 25 amu. The crystalline lattice within the higher energy density dielectric layer may have an average atomic mass unit (amu) greater than or equal to 50 amu. The primary and secondary electrodes may form an area surface greater than or equal to 1 mm². The primary and secondary electrodes may form an area surface greater than or equal to 1 cm². The thickness of the high energy density dielectric layer may be less than 1 micron. The thickness of the high energy density dielectric layer may be in the range of 1-100 nm. The thickness of the primary and secondary conductor layers are in the range of 100 nm to 1 micron. The capacitor may be in electrical communication with an inductor coil. The capacitor may be in electrical communication with a resistive element. The capacitor may be configured to form a resonant electrical storage element.

Another embodiment of the present invention provides an electrical storage parallel capacitor device comprising a primary and a secondary electrode in electrical communication with output and input bus electrodes, respectively, wherein: the primary electrode is in electrical communication with a plurality of primary conducting layers having thicknesses in the range of 20 nm to 100 micron; the secondary electrode is in electrical communication with a plurality of secondary conducting layers having thickness in the range of 20 nm to 100 micron; a high energy density dielectric layer having relative dielectric permittivity greater than $\varepsilon_R \geq 70$ and thickness less than 1 micron is inserted between each of the plurality of primary conducting layers and secondary conducting layers, thus forming a parallel capacitive element; and, the high energy density dielectric in said high energy density dielectric layer has a dielectric polarization response that is determined by orbital deformations of the atomic species forming said high energy density dielectric.

The capacitor may have a high dielectric breakdown material that insulates the primary electrode from the secondary electrode at locations in the multilayer electrical storage capacitor where primary electrode and secondary electrode are found in proximity closer than 100 micron. The high dielectric breakdown material may be amorphous silica. The high energy density dielectric layer may comprise a perovskite ceramic further comprising transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric layer may comprise a perovskite ceramic further comprising lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high energy density dielectric may comprise a perovskite ceramic further comprising post transition metal elements from the group consisting of: indium (In), tin (Sn), lead (Pb), and bismuth (Bi). The high energy density dielectric layer may have a relative dielectric permittivity, $\varepsilon_R$, greater than 200. The high energy density dielectric layer may comprise a perovskite ceramic that is compositionally complex. The high energy density dielectric layer may be theoretically dense and may further comprise a polycrystalline network of uniformly distributed grains having uniform grain size less than or equal to 50 nm. The uniformly distributed grains may further comprise a grain core and a grain boundary material that consists essentially of highly electrically insulating metal oxide phases formed with silicon dioxide. The crystalline lattice within the high energy density dielectric layer may have an average atomic mass unit (amu) greater than or equal to 25 amu. The crystalline lattice within the higher energy density dielectric layer may have an average atomic mass unit (amu) greater than or equal to 50 amu. The primary and secondary electrodes may form an area surface greater than or equal to 1 mm². The primary and secondary electrodes form an area surface greater than or equal to 1 cm². The thickness of the high energy density dielectric layer may be less than 1 micron. The thickness of the high energy density dielectric layer may be in the range of 1-100 nm. The thickness of the primary and secondary conductor layers may be in the range of 100 nm to 1 micron. The parallel capacitor device may be in electrical communication with an inductor coil. The parallel capacitor device may be in electrical communication with a resistive element. The parallel capacitor device may be configured to form a resonant electrical storage element.

Yet another embodiment of the present invention provides a high energy density dielectric that polarizes and depolarizes on femto-second ($10^{-15}$ sec) timescales comprising: a theoretically perovskite electroceramic further comprising a dense polycrystalline network of uniformly distributed grains having uniform grain size less than or equal to 50 nm; and, an intra-granular crystalline lattice that has an average atomic mass unit (amu) greater than or equal to 25 amu.

The intra-granular crystalline lattice may have an average atomic mass unit (amu) greater than or equal to 50 amu. The high energy density dielectric may be compositionally complex. The high energy density dielectric may comprise transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric may further comprise lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high density energy dielectric may further comprise post transition metal elements from the group consisting of: indium (In), tin (Sn), lead (Pb), and bismuth (Bi). The high density energy dielectric may further comprise a grain boundary material that comprises electrically insulating metal oxide phases formed with silicon dioxide. The grain-boundary material may consist essentially of silicon dioxide without any additional metal oxide phases. The high energy density dielectric may be formed as a layer having thickness greater than 1 nm. The high energy density dielectric may be formed on a conductive element.

Still another embodiment of the present invention may provide a resonant high energy density storage device formed on a substrate that comprises: a high energy density capacitor comprising: a primary electrode in electrical communication with an output power bus electrode and at least one primary conducting layer; a secondary electrode in electrical communication with an input power bus electrode and at least one secondary conducting layer; a high energy density dielectric layer inserted between the at least one primary conducting and at least one secondary conducting layer; an inductor in electrical communication with the high energy density capacitor and/or one or both of the power bus electrodes in parallel or series connection; a resistive element that may comprise the internal resistance(s) of conductive elements within the storage device; wherein, the inductor, input/output power bus, and high energy density capacitor are formed on an insulating substrate; and, the inductance value(s), capacitance value(s), and resistance value(s) are selected to cause the high energy storage device to resonate at a particular electromagnetic frequency or range of electromagnetic frequencies.

The resonant high energy density storage device may have a high dielectric breakdown material that insulates the primary electrode from the secondary electrode at locations in the first high energy density capacitor, wherein primary electrode and secondary electrode are situated in proximity to each other closer than 100 micron. The high dielectric breakdown material is amorphous silica. The high energy density capacitor may comprise a plurality of primary conducting layers, secondary conducting layers, and high energy density dielectric layers are configured in parallel between the primary electrode and the secondary electrode. The input power bus and the output power bus may run parallel to one another on the substrate and are located at opposite ends of said high energy density capacitor. The inductor may comprise windings wrapped around a chemically complex electroceramic magnetic core. The electroceramic magnetic core may have a frequency-dependent magnetic permeability that optimally matches the resonant frequencies desired in the high energy density storage device. The resonant high energy density storage device may have resonant characteristics that allow the storage device to be fully charged and discharged in less than 100 milliseconds. The resonant high energy density storage device may have resonant characteristics that allow the storage device to be fully charged and discharged in less than 10 milliseconds. The resonant high energy density storage device may include one or more additional high energy density capacitor(s) that is (are) connected in parallel or in series with the inductor element, the high energy density capacitor, a resistive element, and the power bus electrodes. The resonant high energy density storage device may include one or more additional inductor(s) that is (are) connected in parallel or in series with the inductor element, the high energy density capacitor, a resistive element and the power bus electrodes. The resonant high energy density storage device may includes one or more additional inductor(s) that is (are) connected in parallel or in series with the high energy density capacitors connected in parallel or in series with the inductor element, a resistive element, and the power bus electrodes. The high energy density dielectric layer may be chemically complex. The chemically complex high energy density dielectric layer may comprise a perovskite electroceramic that may comprise a theoretically dense polycrystalline network of uniformly distributed grains having uniform grain size less than or equal to 50 nm. The chemically complex high energy density dielectric layer may have polarization/de-polarization rates that respond on femto-second scales. The uniformly distributed grains may further comprise an intra-granular crystalline lattice having an average atomic mass unit greater than or equal to 25 amu. The intra-granular crystalline lattice may have an average atomic mass unit greater than or equal to 50 amu. The high energy density dielectric layer may comprise a perovskite ceramic further comprising transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric layer may comprise a perovskite ceramic further comprising lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high energy density dielectric may comprise a perovskite ceramic further comprising post transition metal elements from the group consisting of: indium (In), tin (Sn), lead (Pb), and bismuth (Bi). The resonant high energy storage device may be a high energy density capacitor has a dielectric layer thickness in the range of 1 nm to 1 micron. The resonant high energy storage device may be a high energy density capacitor comprising a primary and secondary conductive layers having thickness ranging from 20 nm to 100 micron.

A further embodiment of the present invention provides a planar array of resonant high energy storage elements comprising: one or more linear arrays of storage elements formed on an insulating substrate that are electrically connected in parallel configuration to any other linear array of storage contained within the planar array, such that each linear array further comprises a plurality of resonant high energy storage elements that are electrically connected in parallel configuration with other resonant high energy storage elements within the linear array; wherein each resonant high energy storage element is formed between an electrically conducting input power bus and an electrically conducting output power bus within its linear array; such that each resonant high energy storage element further comprises: a high energy density capacitor additionally comprising: a primary electrode in electrical communication with an output power bus and one or more primary conductive layers; a secondary electrode in electrical communication with an input power bus and one or more secondary conductive layers; wherein a high energy density dielectric layer that separates each primary conductive layers from a nearest neighboring secondary conductive layer; and, at least one inductor element that is electrically connected to the high energy density storage capacitor in series and/or in parallel to the high energy storage capacitor and the input power bus or the output power bus; and, at least one resistive element, which could be the internal resistance of the conducting elements; wherein the inductive, capacitive, and resistive values comprising each storage element are selected to cause each storage element within the array to resonate at a specific electromagnetic frequency or range of electromagnetic frequencies to achieve a desired charge/discharge rate; with, an electrically conducting input power bus for the planar array that electrically terminates the input power bus in each linear array and is electrically isolated from the output power bus for the planar array; and, an electrically conducting output power bus for the planar array that electrically terminates the output power bus in each linear array and is electrically isolated from the input power bus for the planar array.

The input power bus for the planar array may be located on a surface that is at the opposite end of the surface upon which the output power bus for the planar array is located on. The planar array may have amorphous silica incorporated to electrically isolate an input power bus from an output power bus. The planar array may have a high dielectric breakdown material insulating the primary electrode from the secondary electrode at locations in a high energy density capacitor, wherein primary electrode and secondary electrode are situated in proximity to each other closer than 100 micron. The high dielectric breakdown material may be amorphous silica. The high energy density capacitor may comprise a plurality of primary conducting layers, secondary conducting layers, and high energy density dielectric layers configured in parallel between the primary electrode and the secondary electrode. The high energy density dielectric layer may be chemically complex. The chemically complex high energy density dielectric layer may comprise a perovskite electroceramic further comprising a theoretically dense polycrystalline network of uniformly distributed grains having uniform grain size less than or equal to 50 nm. The chemically complex high energy density dielectric layer may have polarization/de-polarization rates that respond on femto-second scales. The uniformly distributed grains may further comprise an intra-granular crystalline lattice having an average atomic mass unit greater than or equal to 25 amu. The intra-granular crystalline lattice may have an average atomic mass unit greater than or equal to 50 amu. The high energy density dielectric layer may comprise a perovskite ceramic further comprising transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric layer may comprise a perovskite ceramic further comprising lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high energy density dielectric may comprise a perovskite ceramic further comprising post transition metal elements from the group consisting of: indium (In), tin (Sn), lead (Pb), and bismuth (Bi). The high energy density capacitor may have a dielectric layer thickness in the range of 1 nm to 1 micron. The planar array may include a high energy density capacitor comprising a primary and secondary conductive layers having thickness ranging from 20 nm to 100 micron. The planar array may include an inductor element comprising windings wrapped around a chemically complex electroceramic magnetic core. The electroceramic magnetic core may have a frequency-dependent magnetic permeability that optimally matches the resonant frequencies desired in the array high energy density storage elements. The planar array may have resonant characteristics that allow the storage device to be fully charged and discharged in less than 100 milliseconds. The planar array may have resonant characteristics that allow the storage device to be fully charged and discharged in less than 10 milliseconds. The planar array may comprise a high energy storage element that further comprises one or more additional high energy density capacitor(s) within that is (are) connected in parallel or in series with the inductor element, the high energy density capacitor, a resistive element, and the power bus electrodes. The planar array may include one or more additional inductors connected in parallel or in series with the inductor element, the high energy density capacitor, a resistive element and the power bus electrodes. The planar array may include one or more additional inductors connected in parallel or in series with the high energy density capacitors connected in parallel or in series with the inductor element, a resistive element, and the power bus electrodes. The planar array may have resonant characteristics that allow the planar array to be fully charged and discharged in less than 100 milliseconds. The planar array may have resonant characteristics that allow the planar array to be fully charged and discharged in less than 10 milliseconds.

A still further embodiment of the present invention provides a three-dimensional array of resonant high energy storage elements comprising a bonded stack of: two or more planar arrays of resonant storage elements, wherein mirror image layouts of a planar array of high energy storage elements are bonded substrate backside to substrate backside; or, two or more planar arrays of resonant storage elements, wherein mirror image layouts of a planar array of high energy storage elements are bonded planar array topside to planar array topside; such that, the input and output bus electrodes vertically align within the three dimensional array for substrate backside to substrate backside and planar array topside to planar array topside bonding configurations; and, the primary electrodes of each storage capacitor within a planar array aligns with the primary electrodes of each mirror image storage capacitor within an opposing planar array in topside-to-topside bonded configurations; wherein a planar array comprises: one or more linear arrays of resonant storage elements formed on an insulating substrate that are electrically connected in parallel configuration to any other linear array of storage contained within the planar array, such that each linear array further comprises a plurality of resonant high energy storage elements that are electrically connected in parallel configuration with other resonant high energy storage elements within the linear array; wherein each resonant high energy storage element is formed between an electrically conducting input power bus and an electrically conducting output power bus within its linear array; such that each resonant high energy storage element further comprises: a high energy density capacitor additionally comprising: a primary electrode in electrical communication with an output power bus and one or more primary conductive layers; a secondary electrode in electrical communication with an input power bus and one or more secondary conductive layers; wherein a high energy density dielectric layer that separates each primary conductive layers from a nearest neighboring secondary conductive layer; and, at least one inductor element that is electrically connected to the high energy density storage capacitor in series and/or in parallel to the high energy storage capacitor and the input power bus or the output power bus; and, at least one resistive element, which could be the internal resistance of the conducting elements; wherein the inductive, capacitive, and resistive values comprising each storage element are selected to cause each storage element within the array to resonate at a specific electromagnetic frequency or range of electromagnetic frequencies to achieve a desired charge/discharge rate; with, an electrically conducting input power bus for the planar array that electrically terminates the input power bus in each linear array and is electrically isolated from the output power bus for the planar array; and, an electrically conducting output power bus for the planar array that electrically terminates the output power bus in each linear array and is electrically isolated from the input power bus for the planar array.

The three-dimensional array may include a topside-to-topside bonded configuration of planar arrays, wherein a metallic bond between the primary electrode of a storage capacitor in a planar array may be formed between the primary electrode of its mirror image storage capacitor within a mirror image planar array in topside-to-topside bonded configurations. The input power bus for the planar array may be located on a surface that is at the opposite end of the surface upon which the output power bus for the planar array is located on. The three-dimensional array may have amorphous silica located to electrically isolate an input power bus from an output power bus. The three-dimensional array may have a high dielectric breakdown material insulating the primary electrode from the secondary electrode at locations in a high energy density capacitor, wherein primary electrode and secondary electrode are situated in proximity to each other closer than 100 micron. The high dielectric breakdown material may be amorphous silica. The three-dimensional array may have high energy density capacitor comprising a plurality of primary conducting layers, secondary conducting layers, and high energy density dielectric layers configured in parallel between the primary electrode and the secondary electrode. The high energy density dielectric layer may be chemically complex. The chemically complex high energy density dielectric layer may comprise a perovskite electroceramic further comprising a theoretically dense polycrystalline network of uniformly distributed grains having uniform grain size less than or equal to 50 nm. The chemically complex high energy density dielectric layer may have polarization/de-polarization rates that respond on femto-second scales. The uniformly distributed grains may comprise an intra-granular crystalline lattice having an average atomic mass unit greater than or equal to 25 amu. The intra-granular crystalline lattice may have an average atomic mass unit greater than or equal to 50 amu. The high energy density dielectric layer may comprise a perovskite ceramic further comprising transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W). The high energy density dielectric layer may comprise a perovskite ceramic further comprising lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb). The high energy density dielectric may comprise a perovskite ceramic further comprising post transition metal elements from the group consisting of: indium (In), tin (Sn), lead (Pb), and bismuth (Bi). The high energy density capacitor may have a dielectric layer thickness in the range of 1 nm to 1 micron. The three-dimensional array may have a high energy density capacitor comprising a primary and secondary conductive layers having thickness ranging from 20 nm to 100 micron. The three-dimensional array may have an inductor element comprising windings wrapped around a chemically complex electroceramic magnetic core. The electroceramic magnetic core may have a frequency-dependent magnetic permeability that optimally matches the resonant frequencies desired in the array high energy density storage elements. The three-dimensional array may have resonant characteristics that allow the storage device to be fully charged and discharged in less than 100 milliseconds. The three-dimensional array may have resonant characteristics that allow the storage device to be fully charged and discharged in less than 10 milliseconds. The three-dimensional array may comprise a high energy storage element that further comprises one or more additional high energy density capacitor(s) within that is (are) connected in parallel or in series with the inductor element, the high energy density capacitor, a resistive element, and the power bus electrodes. The three-dimensional array may include one or more additional inductors connected in parallel or in series with the inductor element, the high energy density capacitor, a resistive element and the power bus electrodes. The three-dimensional array may include one or more additional inductors connected in parallel or in series with the high energy density capacitors connected in parallel or in series with the inductor element, a resistive element, and the power bus electrodes. The three-dimensional array may have resonant characteristics that allow the planar array to be fully charged and discharged in less than 100 milliseconds. The three-dimensional array may have resonant characteristics that allow the planar array to be fully charged and discharged in less than 10 milliseconds.

BRIEF DESCRIPTION OF THE DRAWINGS

The present invention is illustratively shown and described in reference to the accompanying drawings, in which:

FIG. 2E represents Table 1 describing elements usable in admixture of three (3) or more to achieve high energy density.

FIGS. 5A,5B,5C,5D,5E depict various embodiments of a 3D array of resonant high energy storage devices that fully charge and discharge at desirable rates.

DESCRIPTION OF THE PREFERRED EMBODIMENT

Figure 1A:
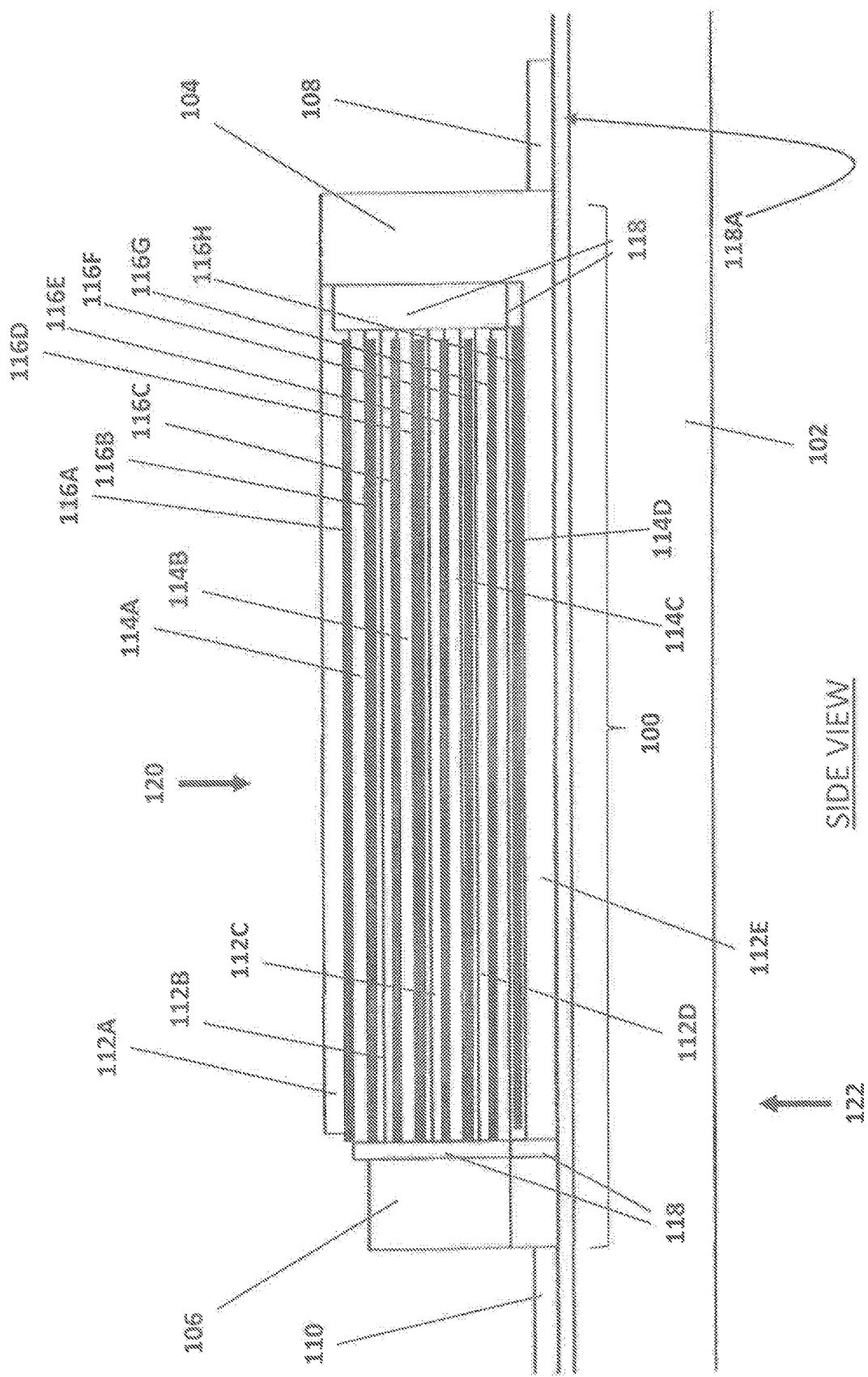
FIGS. 1A,1B depict side and perspective views, respectively, of a high energy density multilayer storage capacitor suitable for high voltage application.

The present invention is illustratively described above in reference to the disclosed embodiments. Various modifications and changes may be made to the disclosed embodiments by persons skilled in the art without departing from the scope of the present invention as defined in the appended claims.

This application incorporates by reference all matter contained in de Rochemont U.S. Pat. No. 7,405,698 entitled "CERAMIC ANTENNA MODULE AND METHODS OF MANUFACTURE THEREOF" (the '698 application), de Rochemont U.S. Ser. No. 11/479,159, filed Jun. 30, 2006, entitled "ELECTRICAL COMPONENT AND METHOD OF MANUFACTURE" (the '159 application), U.S. Ser. No. 11/620,042 (the '042 application), filed Jan. 6, 2007 entitled "POWER MANAGEMENT MODULES", de Rochemont and Kovacs, "LIQUID CHEMICAL DEPOSITION PROCESS APPARATUS AND EMBODIMENTS", U.S. Ser. No. 12/843,112, ('112), de Rochemont, "MONOLITHIC DC/DC POWER MANAGEMENT MODULE WITH SURFACE FET", U.S. Ser. No. 13/152,222 ('222), de Rochemont, "SEMICONDUCTOR CARRIER WITH VERTICAL POWER FET MODULE", U.S. Ser. No. 13/168,922 ('922A), de Rochemont "CUTTING TOOL AND METHOD OF MANUFACTURE", U.S. Ser. No. 13/182,405, ('405), "POWER FET WITH A RESONANT TRANSISTOR GATE", U.S. Ser. No. 13/216,192 ('192), de Rochemont, "SEMICONDUCTOR CHIP CARRIERS WITH MONOLITHICALLY INTEGRATED QUANTUM DOT DEVICES AND METHOD OF MANUFACTURE THEREOF", U.S. Ser. No. 13/288,922 ('922B), and, de Rochemont, "FULLY INTEGRATED THERMOELECTRIC DEVICES AND THEIR APPLICATION TO AEROSPACE DE-ICING SYSTEMS", U.S. Application No. 61/529,302 ('302).

The '698 application instructs on methods and embodiments that provide meta-material dielectrics that have dielectric inclusion(s) with performance values that remain stable as a function of operating temperature. This is achieved by controlling the dielectric inclusion(s)' microstructure to nanoscale dimensions less than or equal to 50 nm. de Rochemont '159 and '042 instruct the integration of passive components that hold performance values that remain stable with temperature in printed circuit boards, semiconductor chip packages, wafer-scale SoC die, and power management systems. de Rochemont '159 instructs on how LCD is applied to form passive filtering networks and quarter wave transformers in radio frequency or wireless applications that are integrated into a printed circuit board, ceramic package, or semiconductor component. de Rochemont '042 instructs methods to form an adaptive inductor coil that can be integrated into a printed circuit board, ceramic package, or semiconductor device. de Rochemont et al. '112 discloses the liquid chemical deposition (LCD) process and apparatus used to produce macroscopically large compositionally complex materials, that consist essentially of a theoretically dense network of polycrystalline microstructures comprising uniformly distributed grains having uniform grain size with maximum dimensions less than or equal to 50 nm. Complex materials are defined to include semiconductors, metals or super alloys, and metal oxide ceramics. de Rochemont '222 and '922A instruct on methods and embodiments related to a fully integrated low EMI, high power density inductor coil and/or high power density power management module. de Rochemont '192 instructs on methods to integrate a field effect transistor that switch arbitrarily large currents at arbitrarily high speeds with minimal On-resistance into a fully integrated silicon chip carrier. de Rochemont '922B instructs methods and embodiments to integrated semiconductor layers that produce a 3-dimensional electron gas within semiconductor chip carriers and monolithically integrated microelectronic modules. de Rochemont '302 instructs methods and embodiments to optimize thermoelectric device performance by integrating chemically complex semiconductor material having nanoscale microstructure. The various embodiments and means claimed in the present application are constructed using liquid chemical deposition (LCD) methods instructed by de Rochemont et al. '112 ('112).

Reference is now made to FIGS. 1A-6B to illustrate various embodiments and means pertaining to the present invention. In a parallel plate capacitor, capacitance, C, measures the capacitor to store electrical energy between conductive electrodes. Capacitance of the storage device is determined by the surface area, A, of the conductors, the distance, d, separating the conductors, and the dielectric density ($\varepsilon_o\varepsilon_R$) of the material that fills the distance, d, between the conducting electrodes, $$C = A\varepsilon_o\varepsilon_R/d \qquad (1)$$

$\varepsilon_o$ is the permittivity of free space, and $\varepsilon_R$ is the relative permittivity of the dielectric material separating the two conductors. It is advantageous to electrically connect a plurality of capacitors in parallel to maximize the capacitance of a storage device comprising more than one capacitor or capacitive layer.

It is an objective of the present invention to maximize the capacitance of a highly reliable storage device while providing means to charge at discharge the accumulated electrical energy at an optimal rate, and to package this functionality in as small a volume and as light a weight as possible to improve the range of an electrically powered vehicle (flight or automotive).

Figure 1B:
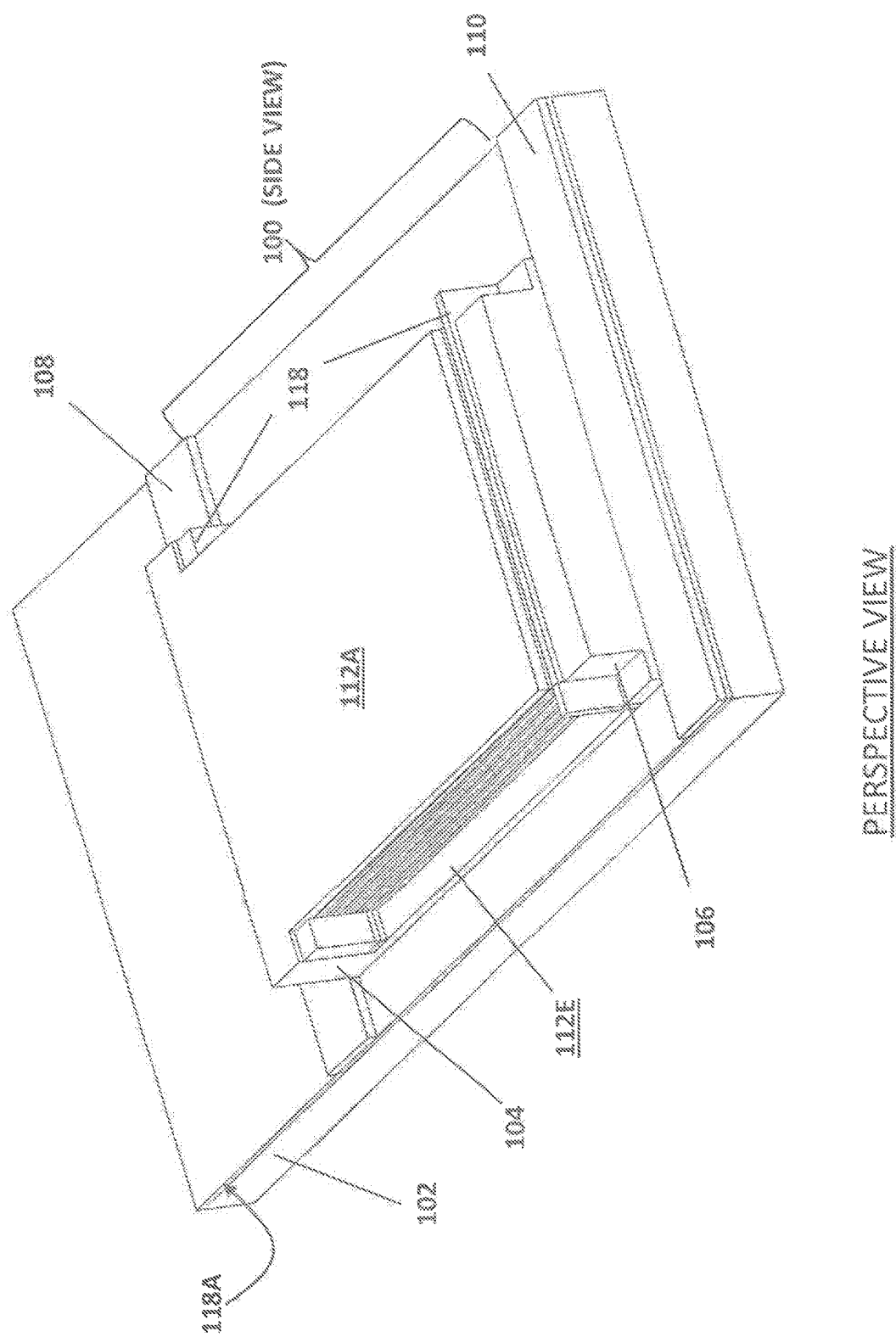

Clearly, it is desirable to insert high energy density materials having $\varepsilon_R > 70$, preferably $\varepsilon_R > 200$ between large area electrodes, (A>1 mm$^2$, preferably >1 cm$^2$), wherein the layer thickness, d, is less than 1 micron, preferably in the range of 1-100 nm to maximize the capacitance C of an individual parallel plate capacitor. FIGS. 1A,1B depict the side view and perspective view, respectively, of a multilayer storage capacitor 100 formed on an insulating substrate 102, wherein the multilayer storage capacitor 100 comprises a primary electrode 104 and a secondary electrode 106. The primary electrode 104 is in electrical communication an Output (Input) bus electrode 108, and the secondary electrode 106 is in electrical communication with an Input (Output) bus electrode 110. The primary 104 and secondary 106 electrodes are in electrical communication with primary conductor layers 112A,112B,112C,112D,112E and secondary conductor layers 114A,114B,114C,114D that are embedded and interleaved within the multilayer capacitor 100. Thickness of the primary conductor layers 112A,112B,112C, 112D,112E and secondary conductor layers 114A,114B, 114C,114D should be gauged to the current loads and internal resistance for a particular design. It is recommended that the thickness range from 20 nm to 100 micron, preferably from 100 nm to 1 micron.

Each of the primary conductor layers 112A,112B,112C, 112D,112E and secondary conductor layers 114A,114B, 114C,114D are separated from one another by a high energy density dielectric layer 116A,116B,116C,116D,116E,116F, 116G,116H. Each of the dielectric layers 116A,116B,116C, 116D,116E,116F,116G,116H forms a capacitor in accordance with equation 1, and each capacitor so formed is connected in parallel through the common connection primary electrode 104 has with primary conducting layers 112A,112B,112C,112D,112E and the common connection secondary electrode 106 has with secondary conducting layers 114A,114B,114C,114D. The multilayer electrical storage capacitor 100 may consist a single dielectric layer 116A inserted between a primary conductor layer 112A and a secondary conducting layer 114A. Alternatively, the multilayer electrical storage capacitor 100 may be configured as a parallel capacitor device that comprises a plurality of dielectric layers 116A,116B,116C,116D,116E,116F,116G, 116H that are inserted between each of the primary conductor layers 112A,112B,112C,112D,112E and each of the secondary conductor layers 114A,114B,114C,114D. High dielectric breakdown material 118, preferably amorphous silica, is applied to insulate the primary 112 and secondary 114 conductor layers from each other at locations within the multilayer capacitor 100 where they come into close proximity, defined as a distance less than 100 micron. High dielectric breakdown material 118 may optionally be applied to the substrate surface 118A prior to forming the multilayer capacitor 100 to prevent electrical shorts between conductive materials forming the primary 104 and secondary 106 electrodes, the Output (Input) 108 and Input (Output) 110 bus electrodes. The multilayer capacitor 100 is configured to place primary conductor layers (112A,112E as depicted in FIGS. 1A,1B), at the top 120 and the bottom 122 of the assembly. The multilayer comprises a plurality of capacitors configured in parallel wherein each high energy density dielectric layer 116 forms a capacitor between the primary 112 and secondary 114 conductor layers that it separates. This parallel configuration maximizes the total capacitance of the multilayer storage capacitor 100, $C_{MULTILAYER}$. Each of the capacitances $C_A, C_B, C_C, C_D, C_E, C_F, C_H$ stored between each high density dielectric layers 116A,116B,116C,116D, 116E,116F,116G,116H is summed as:

$$C_{MULTILAYER} = C_A + C_B + C_C + C_D + C_E C_F + C_H \qquad (2)$$

Robust materials, enabled by LCD manufacturing methods, are needed within the structure to mitigate electromigration and power loss, to minimize thermomechanical fatigue and dissipation currents, and to maximize energy density and stored charge, while permitting reliable operation at voltages greater than 3V, and higher voltages greater than 60V and even 600V. The introduction of high dielectric breakdown material 118,118A curtails electrical shorts during high voltage operation. LCD manufacturing methods ('112) are used to embed high chemical complexity materials with atomic scale chemical uniformity as the high energy density dielectric layer 116. A particular aspect of the application relates to the chemical composition of the high energy density dielectric layers 116.

Reference is now made to FIGS. 2A,2B,2C,2D to illustrate unique features that contribute to the minimization of power loss and dissipation currents within the embedded high energy density dielectric layers 116 and thermomechanical fatigue within multilayer storage capacitor 100.

Figure 2A:
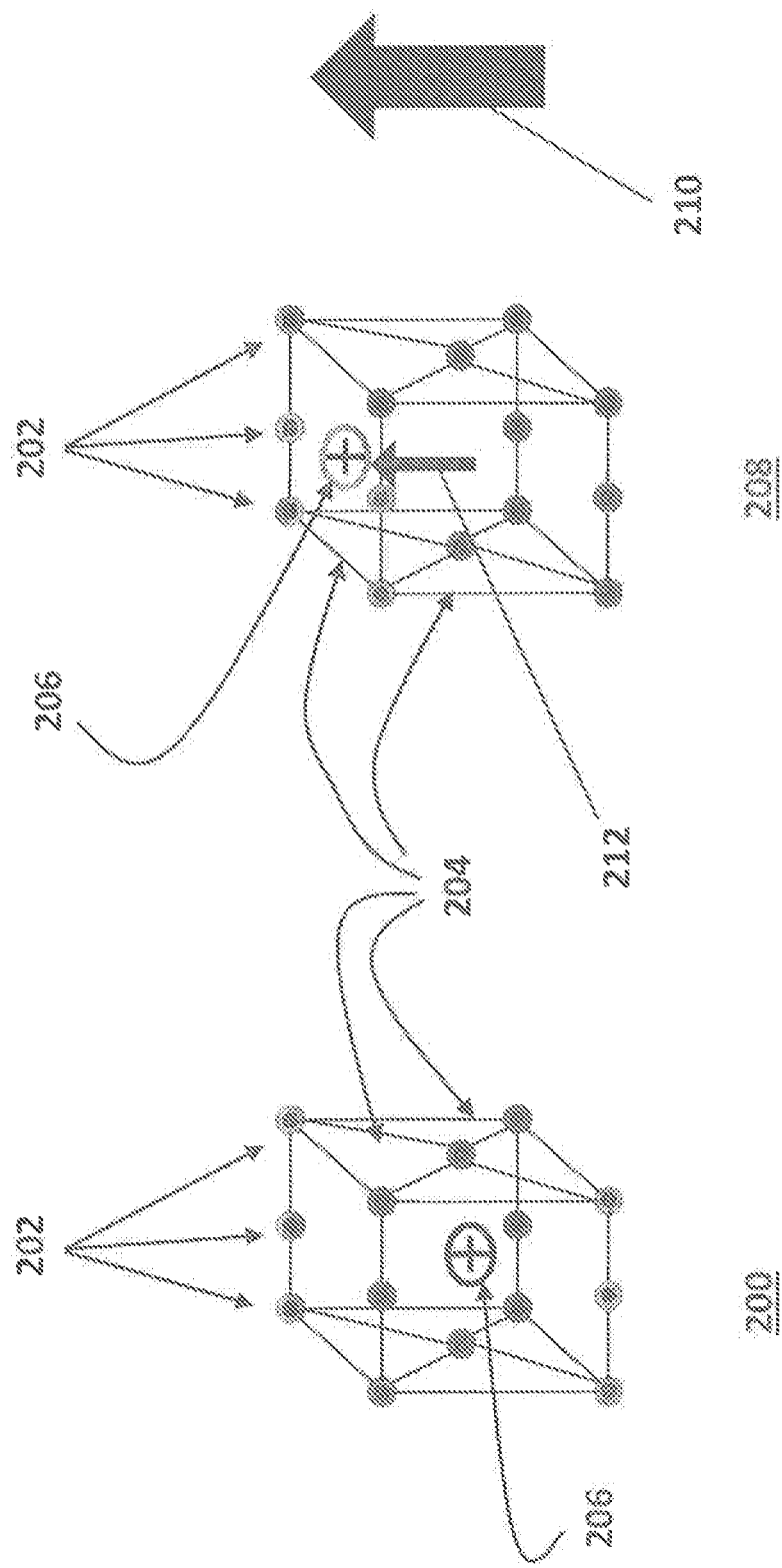
FIGS. 2A,2B,2C and 2D depict the polarization mechanisms within perovskite electroceramics

Perovskite electroceramics form exceptional capacitive dielectrics with high relative permittivity, $\varepsilon_R$. FIG. 2A schematically depicts one mechanism of charge polarization within perovskite electroceramics. The unpolarized state 200 of a perovskite electroceramic crystal wherein rigidly fixed cations and anions 202 are covalently bonded at well-ordered and regularly repeating positions within a crystalline lattice 204. Perovskite electroceramics also comprise mobile cations 206 that hold a neutral position within the crystalline lattice 204 in its unpolarized state 200 that is balanced by purely ionic electrostatic forces between its positive charge and the excess negative charges distributed among rigidly fixed cations and anions 202 within the crystalline lattice 204. Perovskite electroceramics form a polarized state by the application of an external electric field 210, which causes the mobile cations 206 to undergo a physical displacement 212 within the crystalline lattice 202. The physical displacement 212 of the mobile cations' 206 positive charge is the mechanism whereby which electrical energy is stored because the mobile cations 206 will return to its neutral position within the unpolarized state 200 once the external electric field 210 is removed.

The physical displacement 212 is not instantaneous. It will have a polarization time, $\tau_{polarization}$, which is a function of the electroceramics' chemistry. $\tau_{polarization}$ will range between microsecond and nanosecond timescales. This phase delay introduces power loss and signal distortions to the electrical system. The physical displacement 212 also mechanically distorts the crystalline lattice that generates internal strain and will stress adjacent material layers with which the perovskite electroceramic is embedded within an integrated structure, such as the multilayer storage capacitor 100. This stress can cause thermomechanical fatigue within the component layers of the multilayer storage capacitor 100 over time.

Figure 2B:
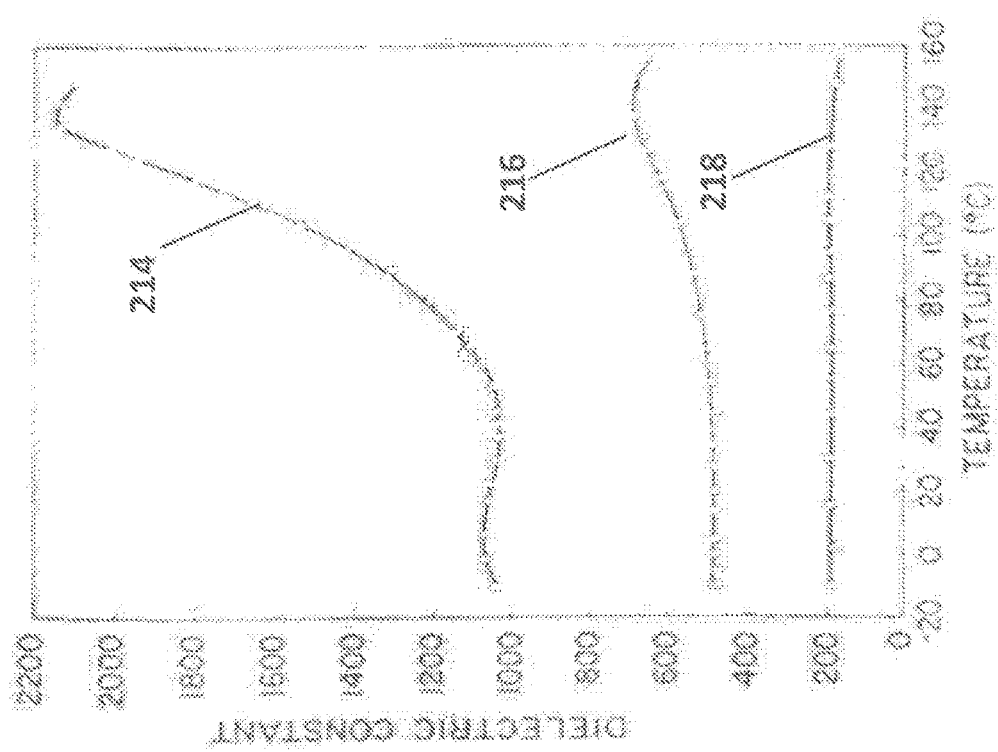
Figure 2C:
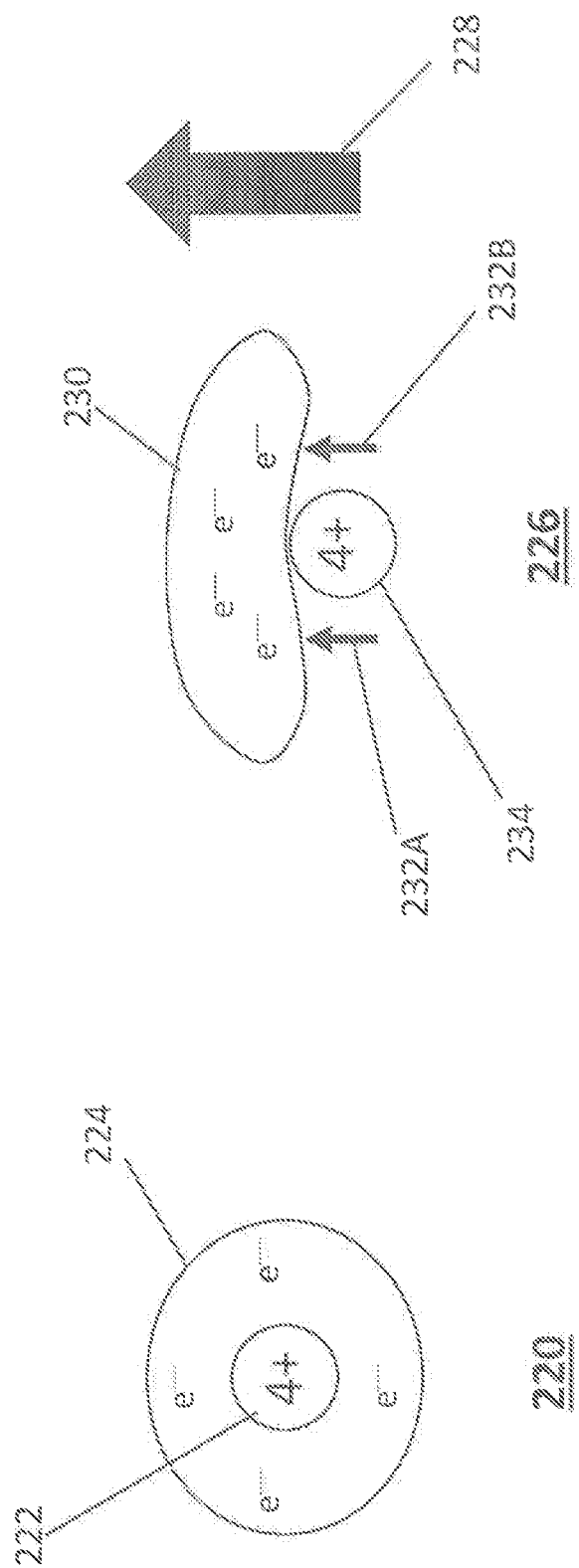

FIGS. 2B,2C illustrate how the physical displacement 212 is a function of the grain size of the perovskite electroceramic and that the nanoscale control over grain size and grain chemistry enabled by LCD manufacturing methods can be used to eliminate thermomechanical fatigue, power losses, and phase distortions attributable to the physical displacement 212. FIG. 2B illustrates the dielectric constant of barium titanate ($BaTiO_3$) perovskite electroceramic as a function of temperature when the electroceramic has uniform grain size of 200 nm 214, 100 nm 216, and 34 nm 218. Orbital deformation, illustrated in FIG. 2C, of the rigidly fixed cations and anions 204 are the sole polarization mechanism contributing to the electroceramic dielectric constant when the electroceramic grain size is constrained to dimensions less than 50 nm 218. The unpolarized state of rigidly fixed cations and anions 220 comprise a positively charge nucleus 222 surrounded by a balanced orbital electron cloud 224 having offsetting negative charge that neutralizes the positively charge nucleus 222 and produces no net polarization. The polarized state of rigidly fixed cations and anions 226 is produced by the application of an applied external electric field 228 that induces a deformed orbital electron cloud 230. The charge displacement induced by the deformed orbital electron cloud 230 generates internal atomic polarization components 232A,232B between the net positive charges of the exposed nucleus 234 of the rigidly fixed cations and anions 220 and the unbalanced negative charge in the deformed orbital electron cloud 230. The internal atomic polarization components 232A,232B have polarization response and relaxation (de-polarization) rates that fully respond on femtosecond ($10^{15}$ second) timescales.

The physical displacement 212 of mobile cations 206 is generated by cooperative internal electric fields that are only strong enough to displace the mobile cations 206 and overcome the mechanical inertia that resists the deformation of the crystalline lattice 204 when the electroceramic grain size is greater than 50 nm. It is therefore a specific objective to minimize signal distortion, power loss and thermomechanical fatigue to embed high energy density dielectric layers 116 that polarize and depolarize on femto-second timescales because they comprise perovskite electroceramic having uniform grain chemistry and grain size less than 50 nm.

As is self-evident from FIG. 2C, internal atomic polarization components 232A,232B are proportional to the number of electrons within the deformed orbital electron cloud 230 and the net positive charges of the exposed nucleus 234. Since number of orbital electrons and protons contributing positive charge to the atomic nuclei of the rigidly fixed cations and anions 206 directly correspond to their atomic mass unit (amu), it is a preferred embodiment of the present invention to construct multilayer storage capacitors 100 that incorporate high energy density dielectric layers 116 wherein the average amu within the intra-granular crystalline lattice 204 is greater than or equal to 25 amu, preferably greater than or equal to 50 amu. LCD manufacturing methods permit the reliable fabrication of dielectric layers having high chemical complexity comprising three or more metal oxide components. The basic stoichiometry of titanate perovskite electroceramics is given by the formula equation:

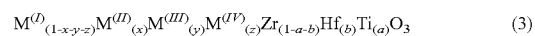

where $M^{(I)}$, $M^{(II)}$, $M^{(III)}$, $M^{(IV)}$ are additional metal oxide components that form a thermodynamically stable perovskite crystal. The same general relationship applies to niobate and tantalate electroceramics, which are implicitly claimed by the present invention. Higher average amu is achieved by incorporating higher amu elements into the perovskite chemical formula. It is therefore a specific embodiment of the application to claim high energy density dielectric layers 116 that comprise a perovskite electroceramic that includes three or more metal oxide components that further comprise an admixture of three (3) or more of the elements listed in Table I as shown in FIG. 2E.

TABLE I

| Transition Metal Elements | | | | | | | | | | | | | |
| --- | --- | --- | --- | --- | --- | --- | --- | --- | --- | --- | --- | --- | --- |
| Symbol | Sc | Ti | V | Cr | Mn | Zn | Y | Zr | Nb | Mo | Hf | Ta | W |
| amu | 21 | 22 | 41 | 42 | 25 | 30 | 38 | 40 | 41 | 42 | 72 | 73 | 74 |
| Lanthanide Metal Elements | | | | | | | | | | | | | |
| Symbol | La | Ce | Pr | Nd | Sm | Eu | Gd | Tb | | Dy | | Ho | Yb |
| amu | 57 | 58 | 59 | 60 | 62 | 63 | 64 | 64 | | 66 | | 67 | 70 |
| Post Transition Metal Elements | | | | | | | | | | | | | |
| Symbol | | In | | | Sn | | | Pb | | | | | Bi |
| amu | | 49 | | | 50 | | | 82 | | | | | 83 |

Figure 2D:
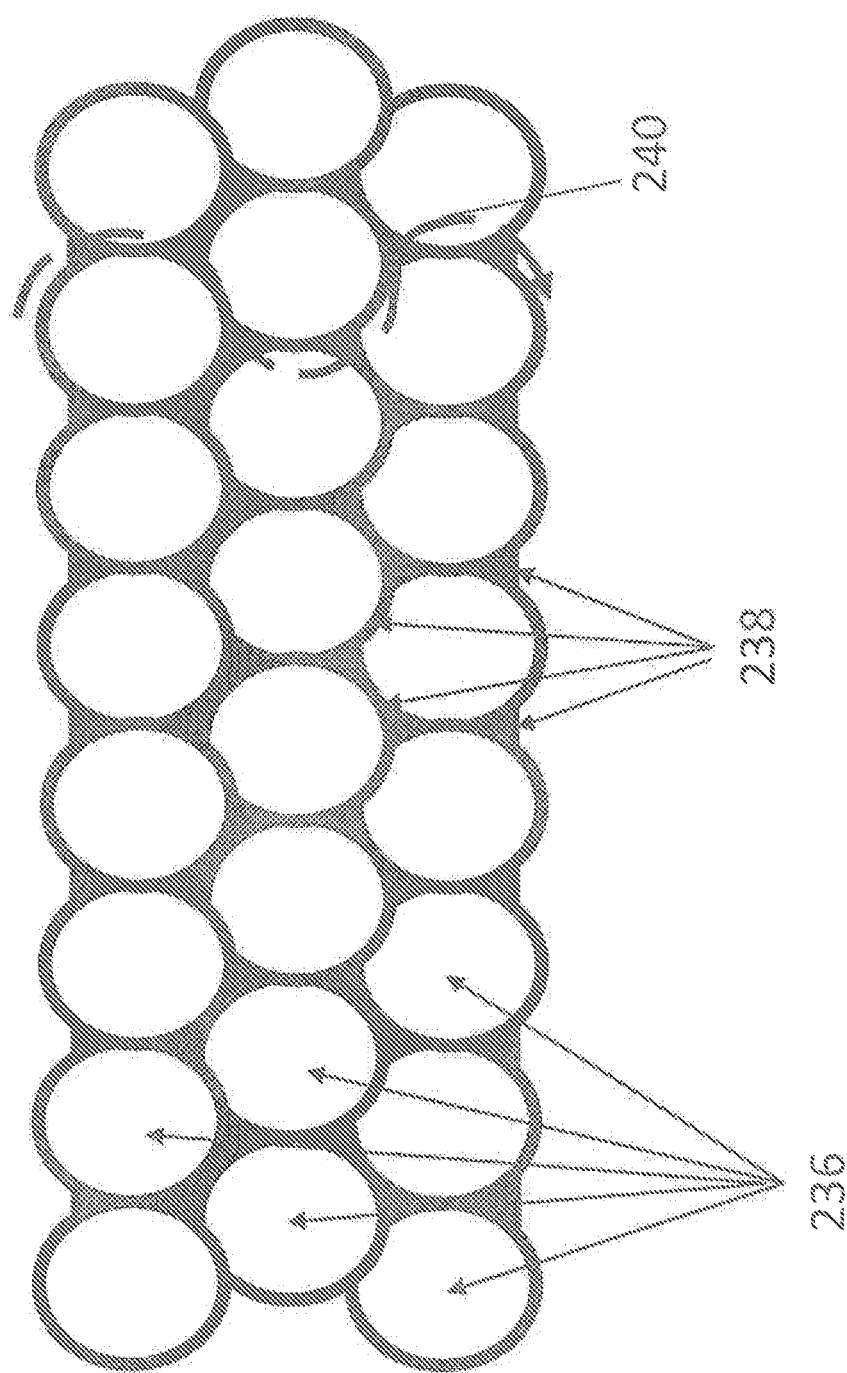

Reference is now made to FIG. 2D to illustrate means to minimize dissipation currents that will introduce power loss and short the multilayer storage capacitor, especially when the thickness d of the high energy density dielectric layer 116 is extremely thin (≤100 nm). Often impurities that are introduced during electroceramic processing will form conductive oxides that are not thermodynamically compatible with the electroceramic crystalline lattice 204. These conductive metal oxide species will migrate from the electroceramic grain core 236 to the electroceramic grain boundaries 238 during processing and form conductive pathways 240 that generate dissipation currents and power loss. Therefore, a particular aspect of the invention dopes the electroceramic composition described by equation (3) with small amounts of silicon dioxide ($SiO_2$) that will migrate from the grain core 236 and into the grain boundaries 238 to form highly electrically insulating metal oxide phases with the grain core material that resist dissipation currents and neutralize the formation of conductive pathways 240.

Figure 3A:
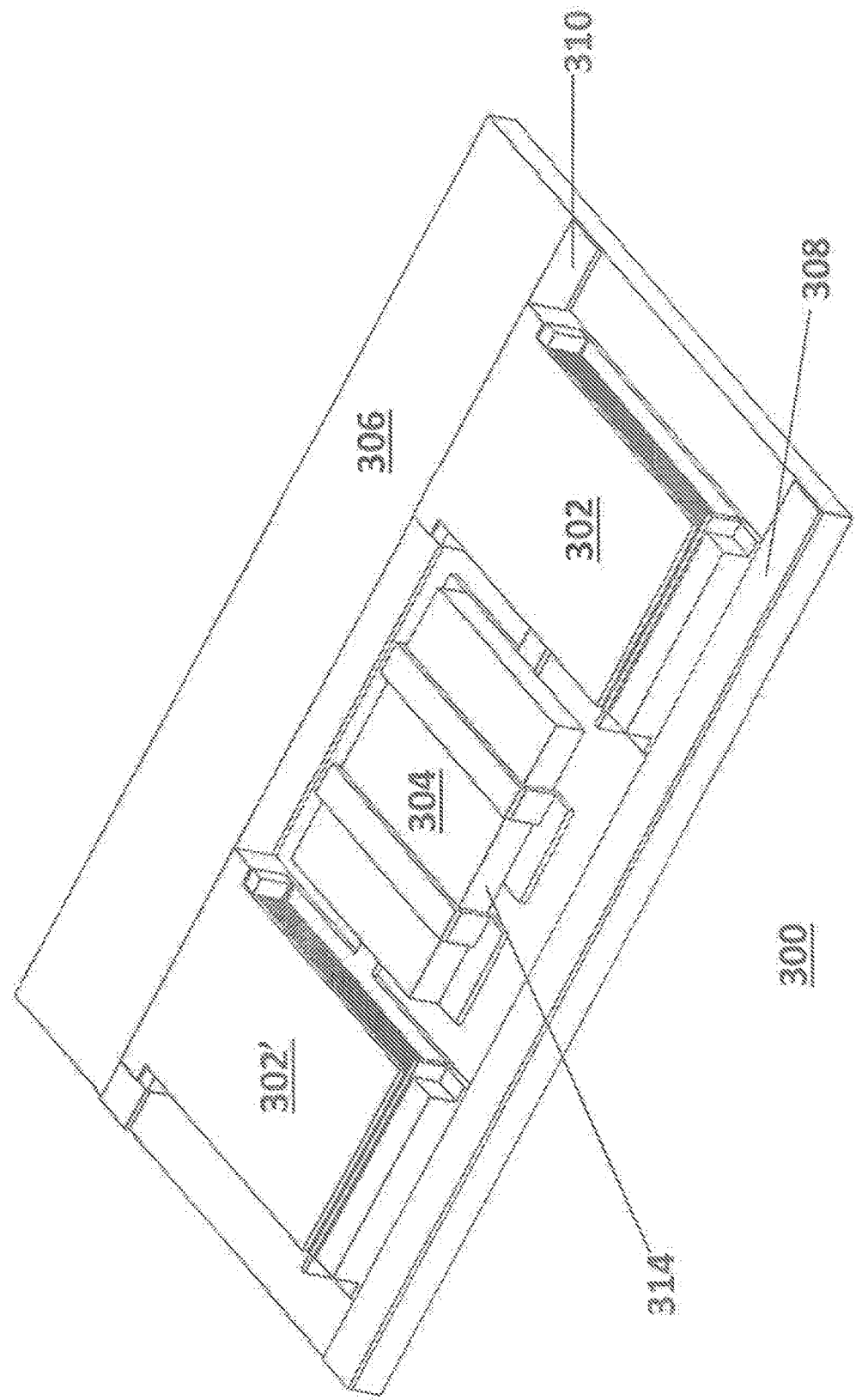
FIGS. 3A,3B,3C,3D,3E,3F,3G,3H depict resonant high energy storage devices that fully charge and discharge one or more high energy density multilayer capacitors at desirable rates.
Figure 3B:
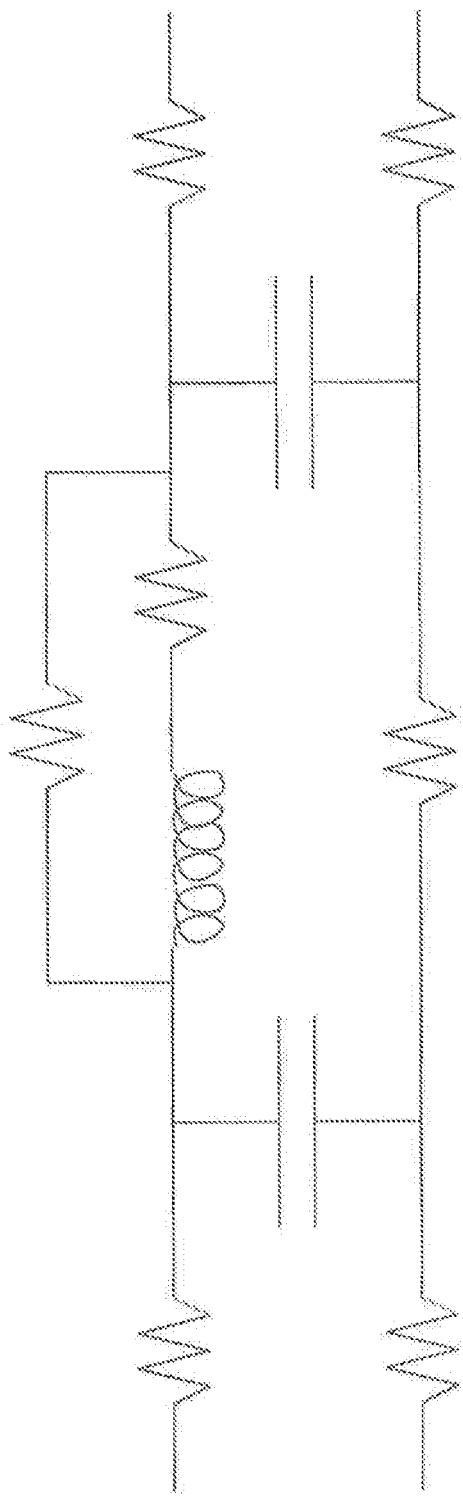

Reference is now made to FIGS. 3A,3B,3C,3D,3E,3F,3G, 3H to illustrate the use of inductive components to achieve optimal charge and discharge rates for the high energy storage device claimed by the present application. A multilayer capacitor 100 will have a charge/discharge rate determined that is determined by the RC time constant resulting from the internal resistance, R, of the capacitor's internal conductive elements within the storage device and the capacitor's total capacitance, $C_{MULTILAYER}$. It has an objective of the present invention to apply the presented art to the construction of small form factor capacitors that have capacitances exceeding 1 farad (1 F), preferably exceeding 1 kilo-farad (1 KF), and charge/discharge in time increments of 10 milliseconds or less. These high capacitances impose RC time constants that restrict the ability to achieve those charge/discharge rates. Therefore, it is an additional embodiment of the present invention to produce a resonant high energy density storage device 300 that includes a primary multilayer storage capacitor 302 (100) in electrical communication with an inductor 304 formed or bonded to the insulating substrate 306, such that the resonant characteristics of the RLC circuit generated created by the inductor 304, the primary multilayer storage capacitor 302, and the internal resistance of the internal conductive components and the INPUT (OUTPUT) power bus 308 and the OUTPUT (INPUT) power bus 310 allow the resonant high energy density storage device 300 to be fully charged and discharged in less than 100 milliseconds (100 ms), preferably less than 10 milliseconds (10 ms). The resonant high energy density storage device 300 may optionally include a secondary multilayer storage capacitor 302' that is electrically connected with primary multilayer storage capacitor 302. The inductor 304 comprises inductor windings 312 that wrap around a magnetic core 314, which further comprises a chemically complex electroceramic having a frequency-dependent magnetic permeability that optimally matches the resonant frequencies desired in the storage device. The inductor 304 may be electrically connected series between the primary multilayer storage capacitor 302 and the secondary multilayer storage capacitor 302' and in parallel with the internal resistance of a power bus 310 or 308, as depicted in FIGS. 3A,3B.

Figure 3C:
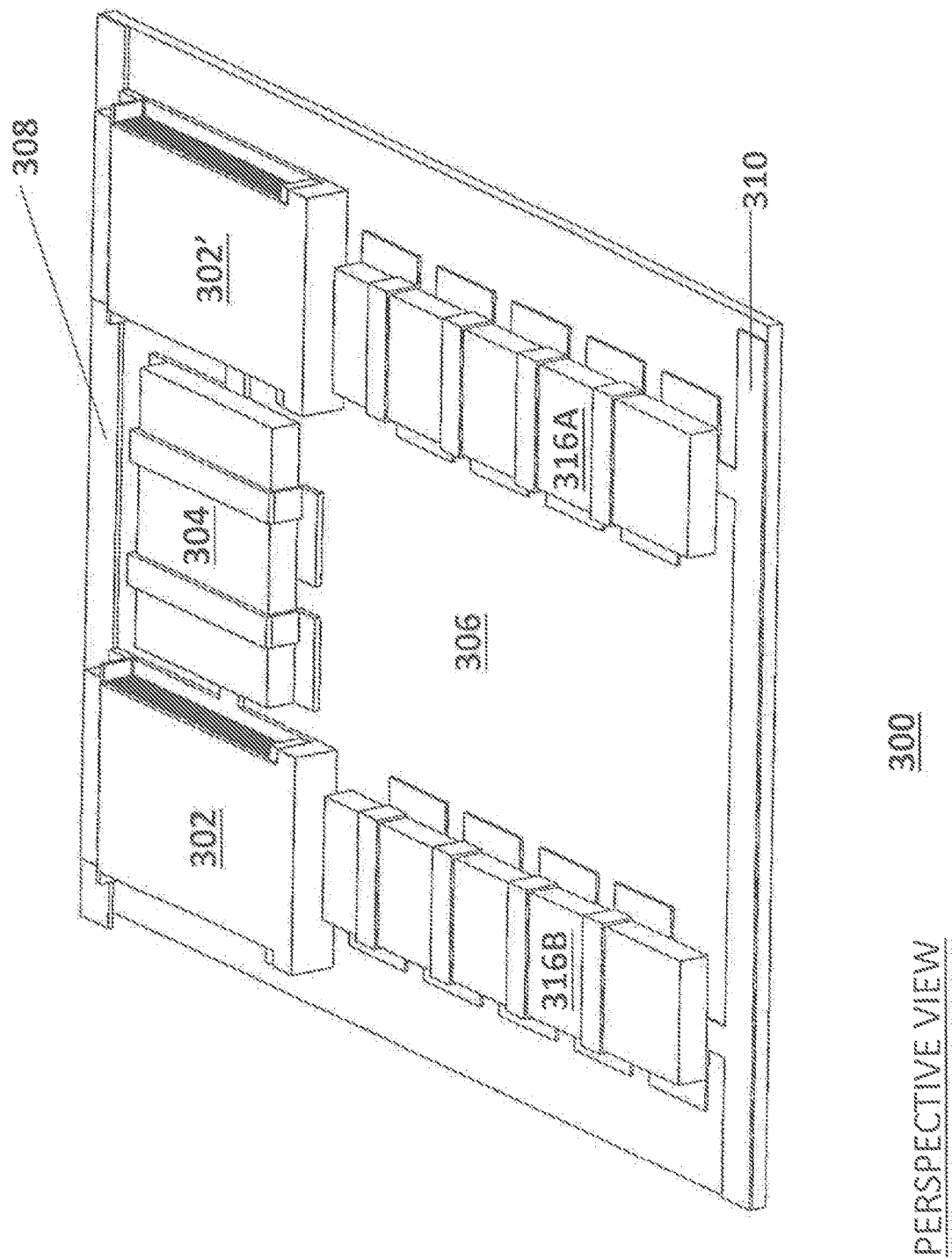
Figure 3D:
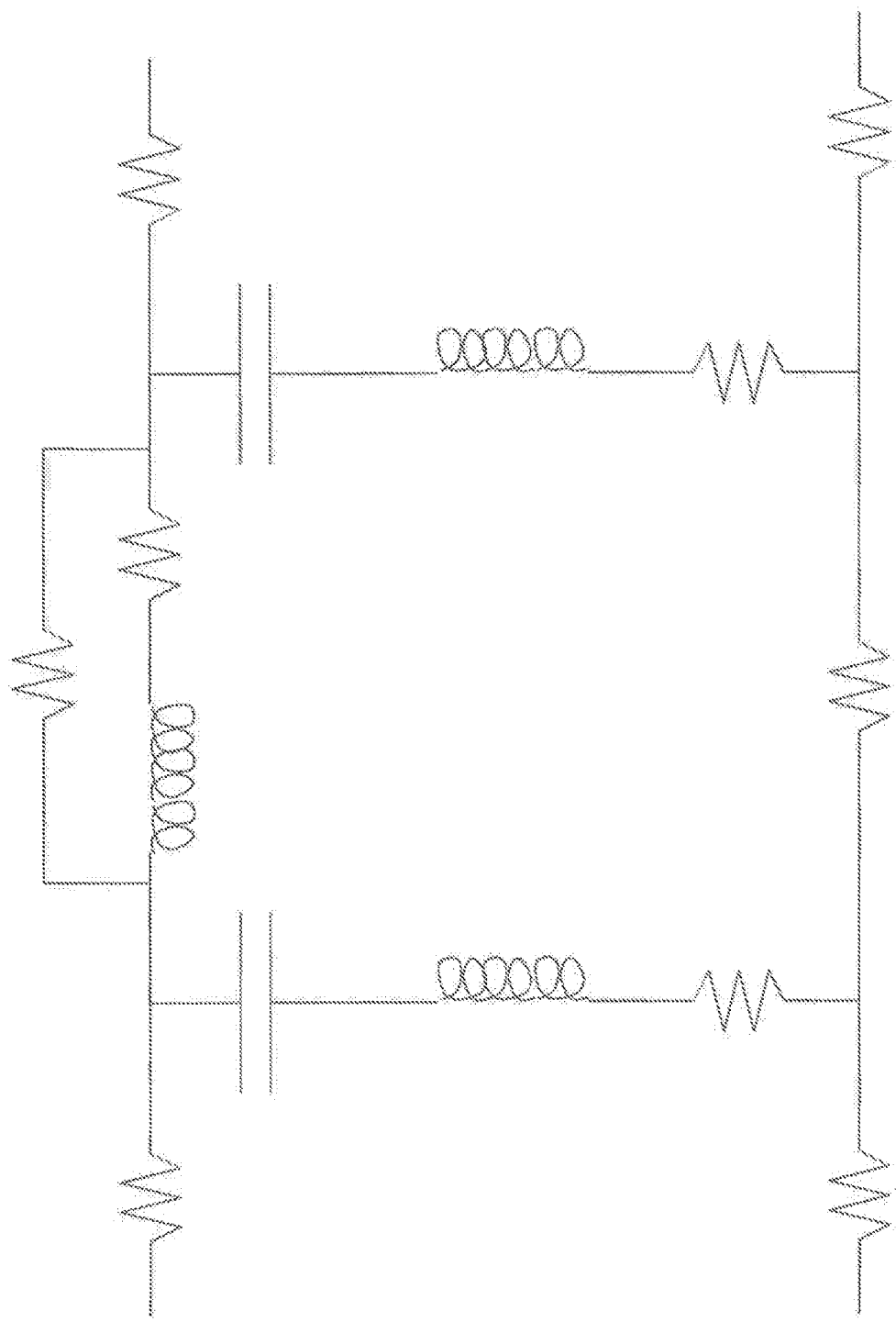
Figure 3E:
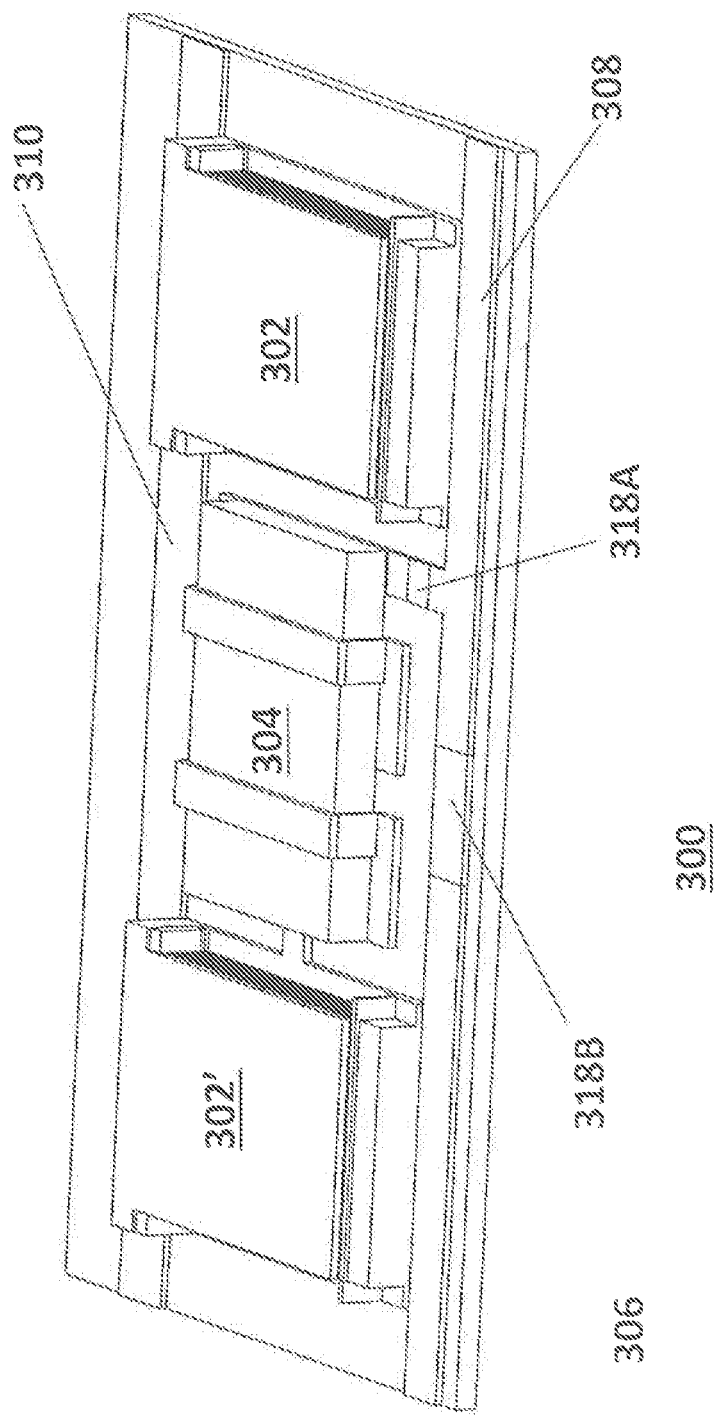
Figure 3F:
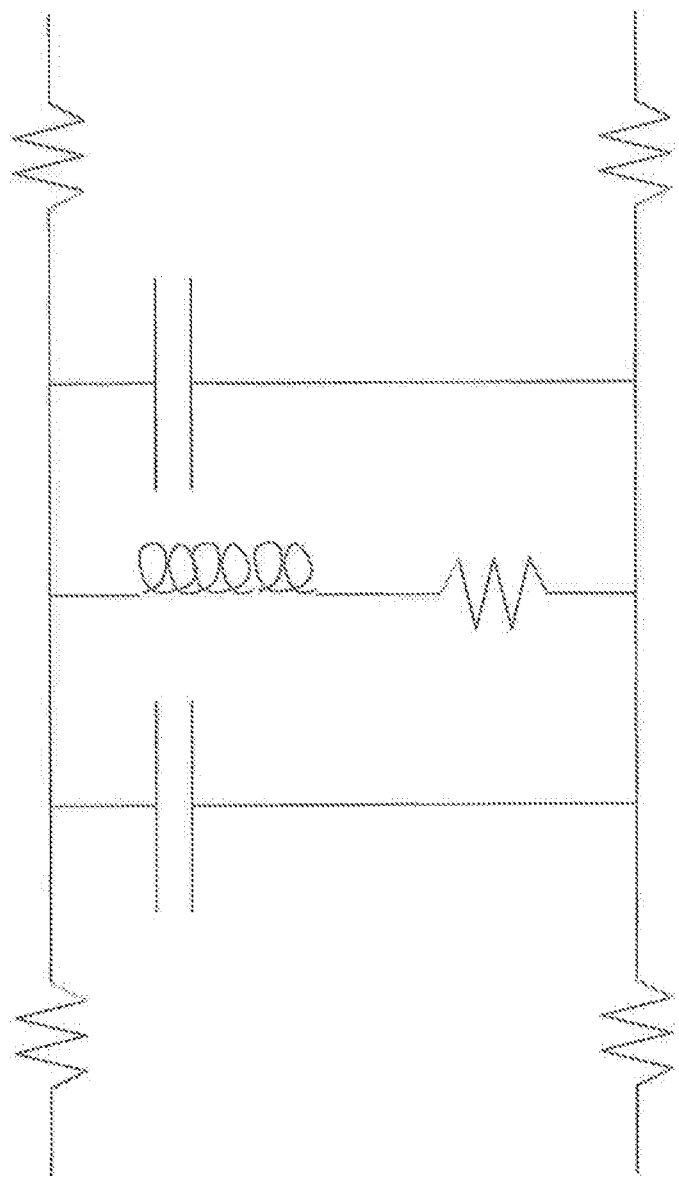
Figure 3G:
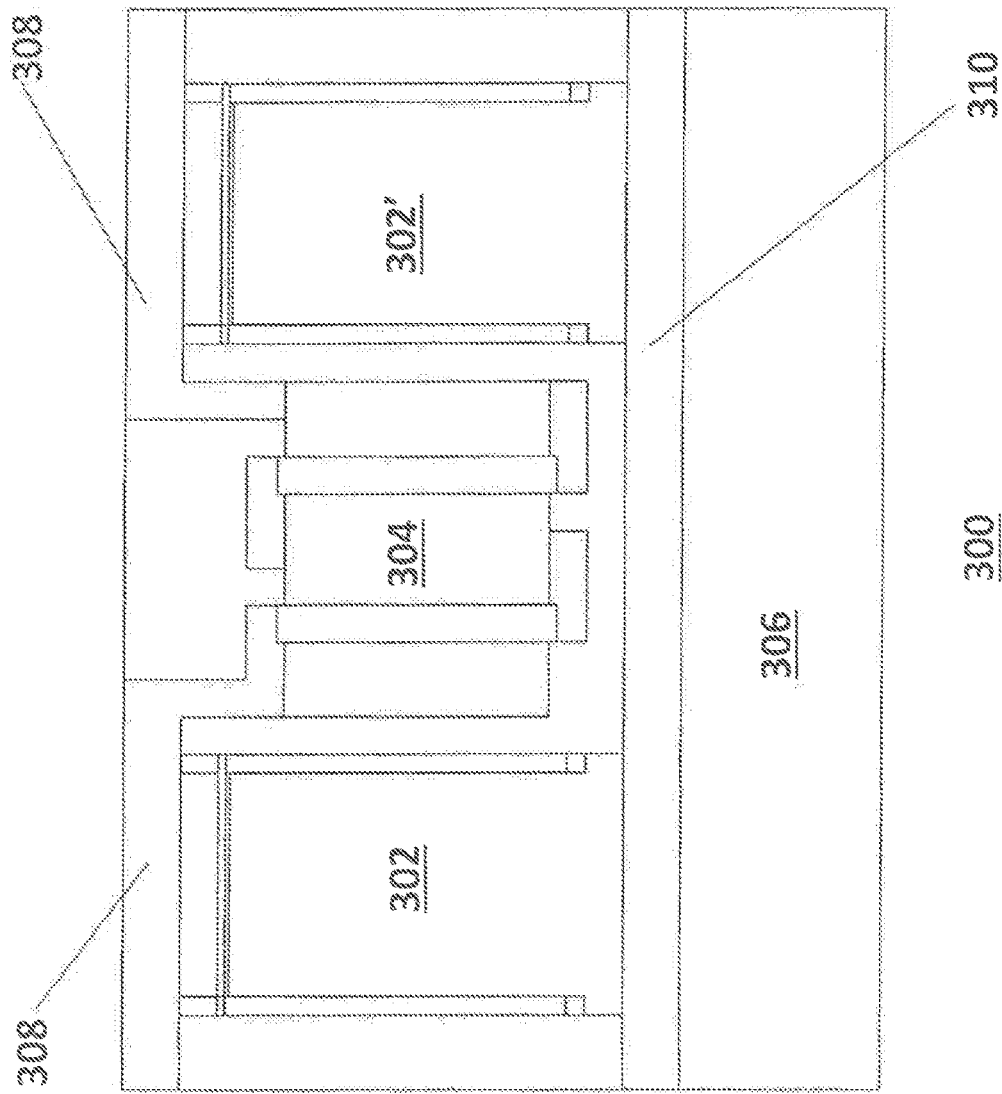
Figure 3H:
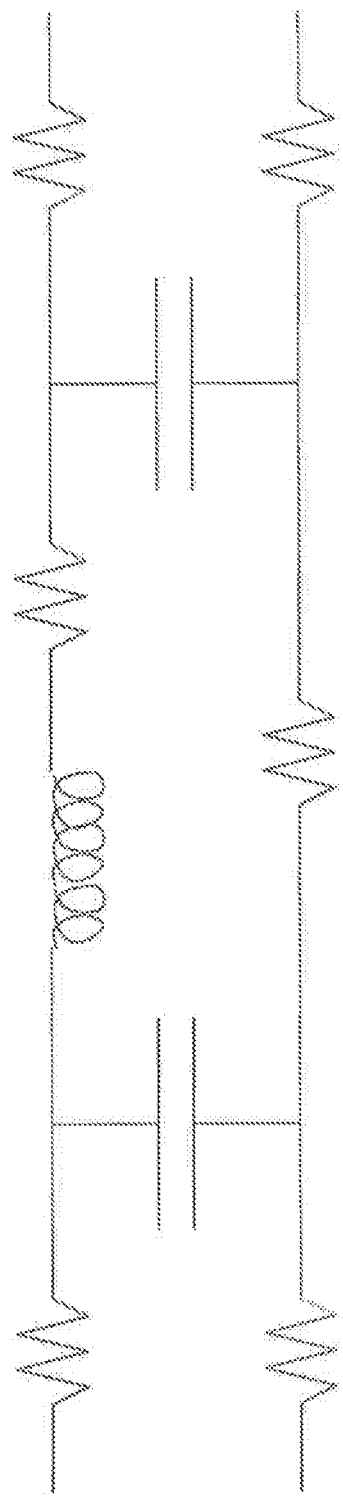

Any electrical arrangement of basic components that produces the resonant characteristics desired by a particular design objective is contemplated by the application. The resonant high energy density storage device 300 may optionally include additional inductors 316A,316B that are connected in parallel, with or without the inductor 304 connected in series, as depicted in FIGS. 3C,3D. Alternatively, the resonant high energy storage device 300 may comprise a single inductor 304 electrically connected in parallel with the primary multilayer storage capacitor 302 and the secondary multilayer storage capacitor 302'. (See FIGS. 3E,3F). The resonant high energy storage device 300 may also include a parallel connected resistive ceramic element 318A or a series connected resistive ceramic element 318B as may be required by a given design objective. Or, the resonant high energy storage device 300 may comprise a single inductor 304 simply connected in series with its internal conductor resistance as depicted in FIGS. 3G,3H.

Figure 4A:
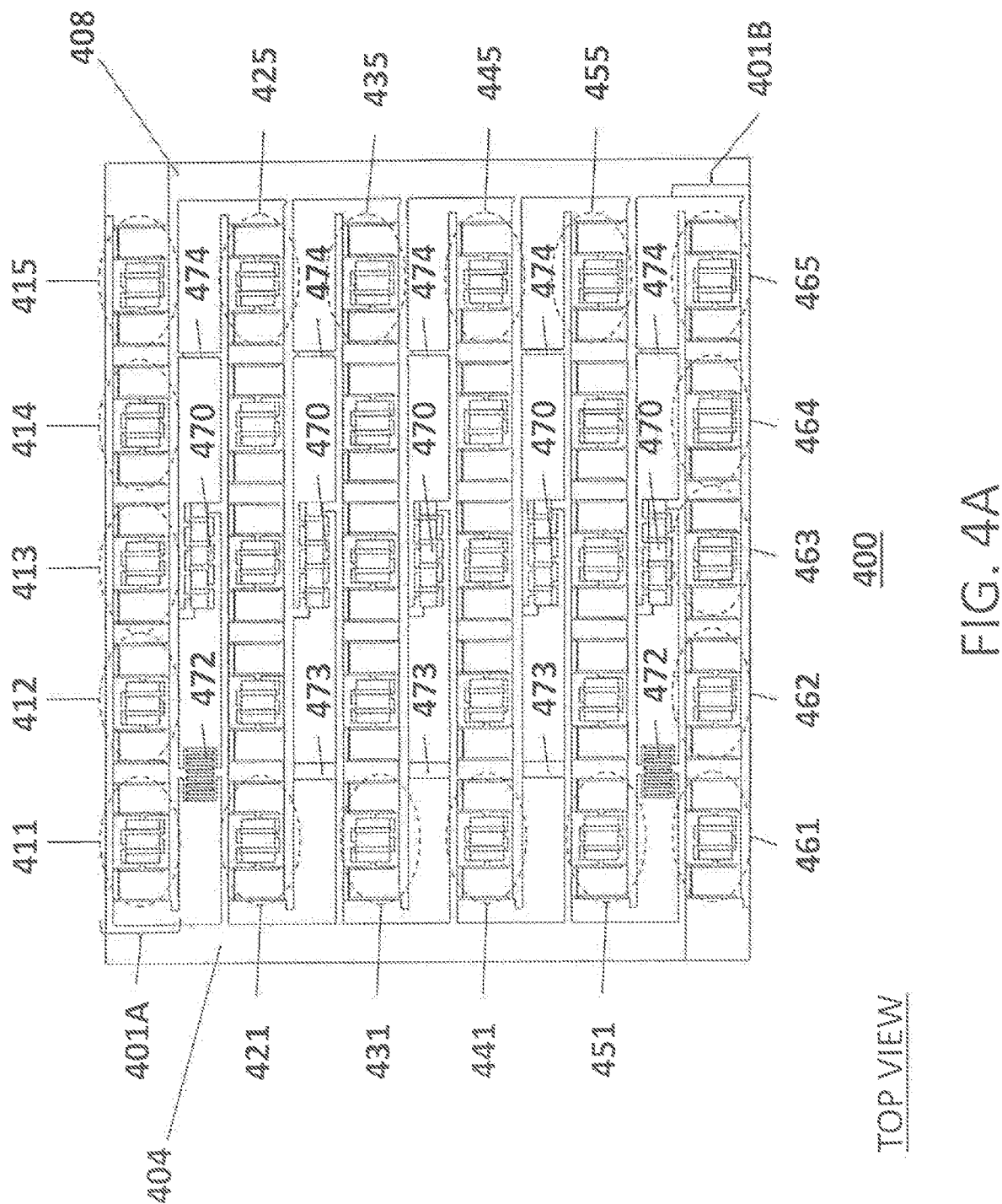
FIGS. 4A,4B,4C illustrate depict a planar array of resonant high energy storage devices that fully charge and discharge at desirable rates.
Figure 4B:
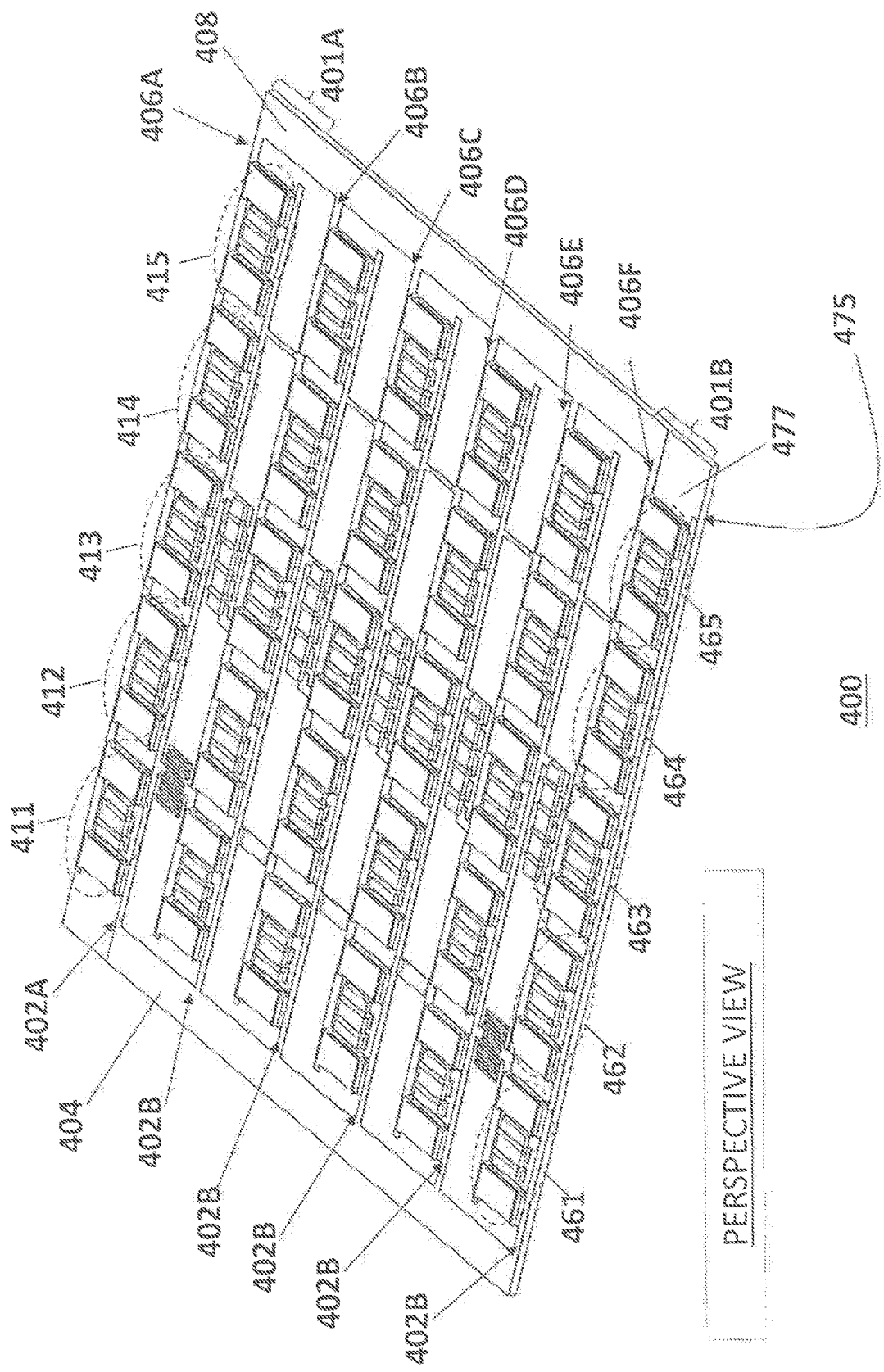
Figure 4C:
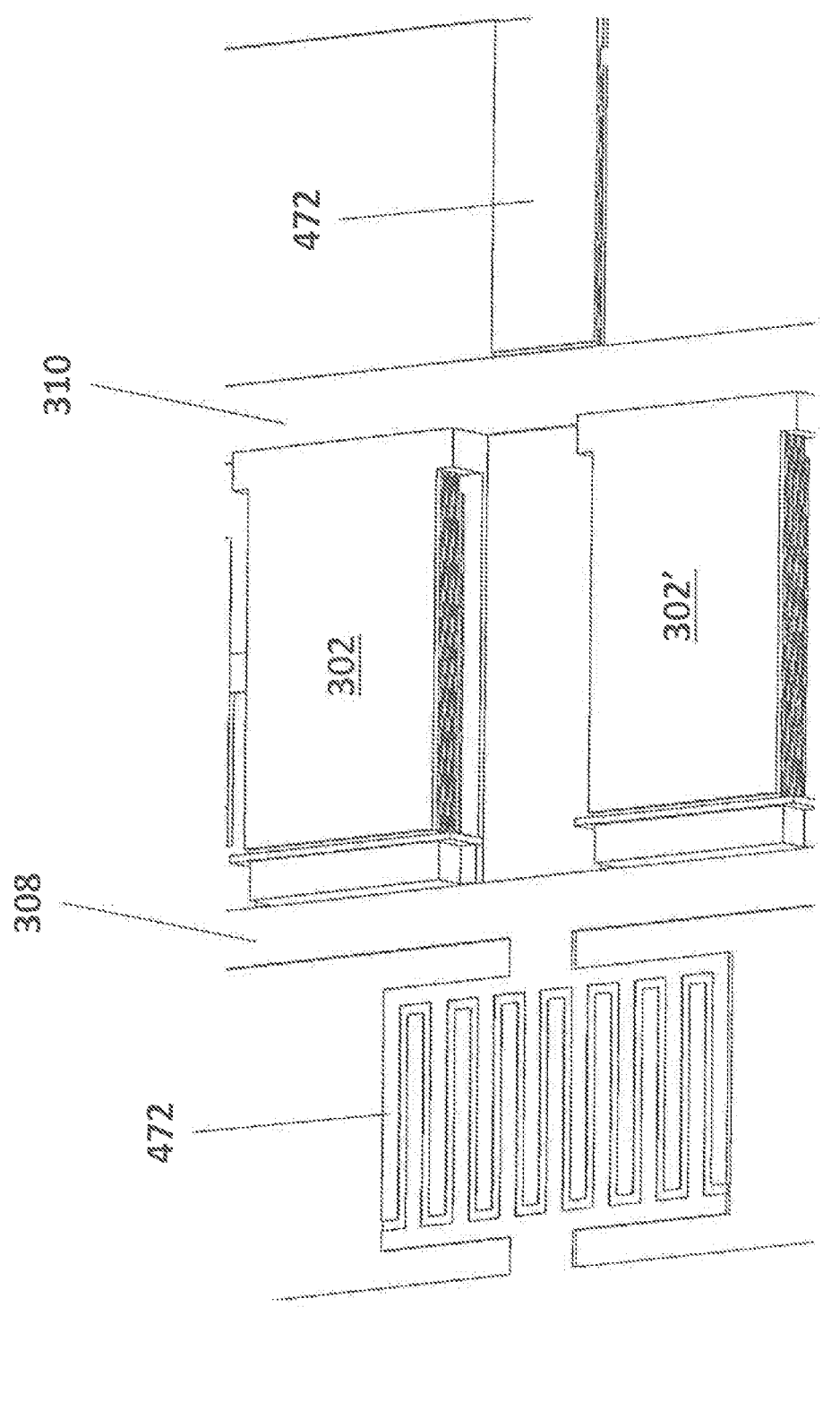

Reference is now made to FIGS. 4A,4B,4C to illustrate a particular aspect of the invention that configures resonant high energy storage device 300 within a planar array 400 of resonant high energy storage elements 411,412,413,414, 415,421,425,431,435.441,445,451, 455,461,462,463,464, 465 configured as linear arrays 401A,401B in parallel electrical connection to maximize the capacitance of the planar array 400. (Note, label numbering format uses protocol common to designating array and elements and the resonant high energy storage devices located in the center of the array are not labeled for visual clarity). The INPUT (OUTPUT) power buses 402A,402B,402C,402D,402E of the planar array 400 forms a parallel electrical connection between each linear array 401A,401B of high energy storage device elements (411,412,413,414,415 and 461,462,463,464,465) to an external INPUT (OUTPUT) electrode 404. The INPUT (OUTPUT) power buses 402A,402B,402C,402D, 402E, 402F are also electrically configured in parallel with the external INPUT (OUTPUT) electrode 404. Similarly, The OUTPUT (INPUT) power buses 406A,406B,406C,406D, 406E of the planar array 400 forms a parallel electrical connection between each linear array 401A,401B of resonant high energy storage device elements (411,412,413,414, 415 and 461,462,463,464,465) to an external OUTPUT (INPUT) electrode 408. The OUTPUT (INPUT) power buses 406A,406B,406C,406D,406E,406F are also electrically configured in parallel with the external OUTPUT (INPUT) electrode 408.

The parallel configuration of the one or more multilayer storage capacitors within a resonant high energy storage device causes each resonant high energy storage device element in a linear array 401A,401B to have capacitance, $C_{STORAGE}$ equal to:

$$C_{STORAGE} = C_{MULTILAYER\ (I)} + C_{MULTILAYER\ (II)} \qquad (4a)$$

Each linear array will have capacitance, $C_{LINEAR}$, equal to:

$$C_{LINEAR} = C_{STORAGE\ 11} + \ldots + C_{STORAGE\ 16} \qquad (4b)$$

Each planar array will have capacitance, $C_{PLANAR}$, equal to:

$$C_{PLANAR} = C_{LINEAR\ 1} + \ldots + C_{LINEAR\ 6} \qquad (4c)$$

There is no restriction on the number of resonant high energy storage devices that can be inserted within a massively parallel configuration. A planar array may assume n rows by m columns of resonant high energy storage devices, in which case its capacitance, $C_{PLANAR}$, would be equal to:

$$C_{PLANAR} = \Sigma_i^n \Sigma_i^m C_{ij} \qquad (4d)$$

Reactive elements may be inserted in series or in parallel inserted between the linear arrays 401A,401B as may be required to maintain resonant properties to assure that the planar array 400 has the desired charge/discharge rates of a given design objective. The reactive elements may comprise, as needed, inductors 470, capacitors 472,473, and resistors 474. The capacitors 472,473 may take the form of an interleaved capacitor 472 or a parallel plate or multilayer capacitor 473 as may be optimal for a given design.

In certain high voltage/high power applications it would be advantageous that the planar array 400 be formed upon an insulating substrate that has sufficient thermal properties to function as a heat sink. In this instance, it might be desirable to form the planar array on a carbide or MAX-phase material, or upon an insulating substrate upon which LCD deposition processes have been used to apply MAX-phase layers that are sufficiently thick to function as a heat sink. In specific embodiments detailed below, it may be desirable to apply a bonding oxide or a bonding metal to the substrate's opposing major surface 475. of the substrate 477 upon which the planar array 400 is formed.

Figure 5A:
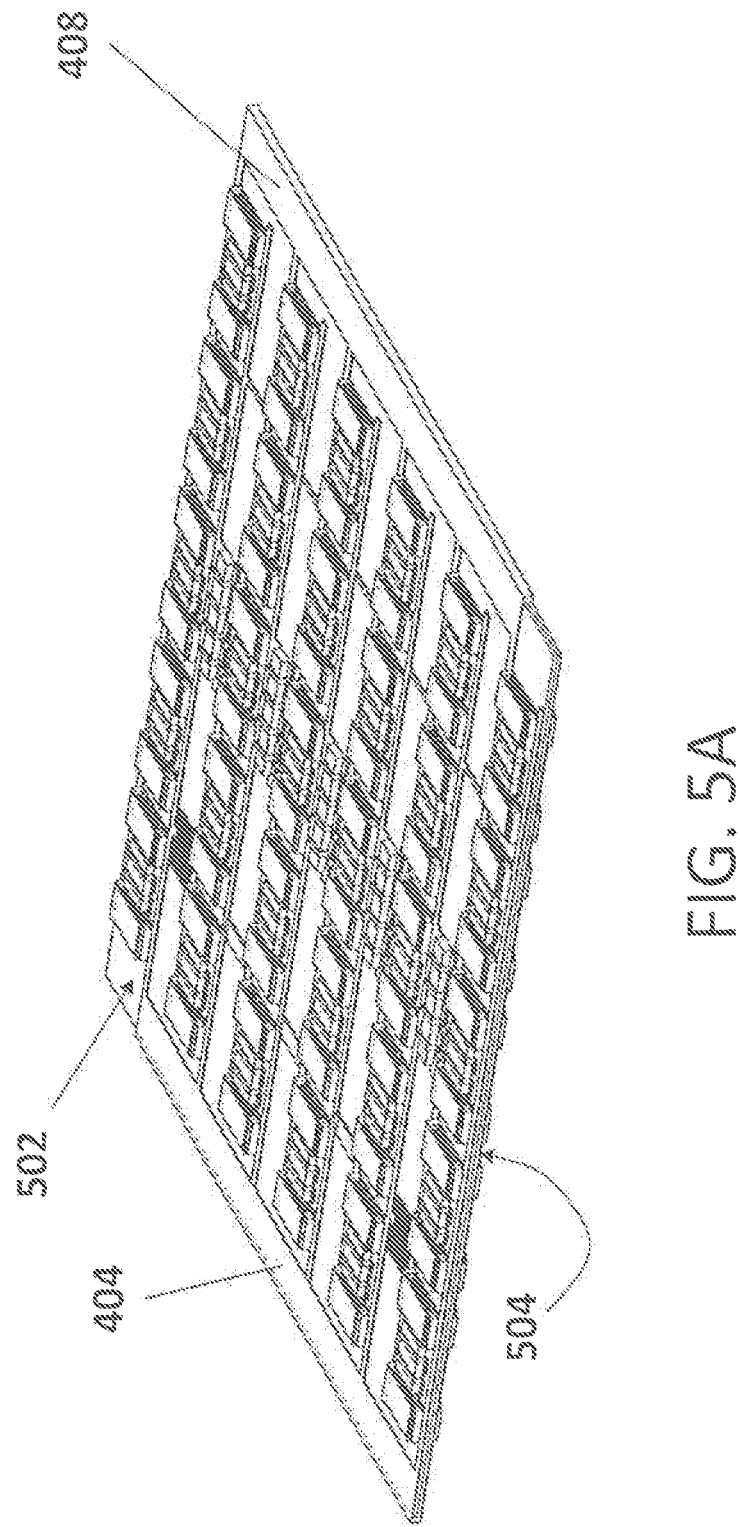
Figure 5B:
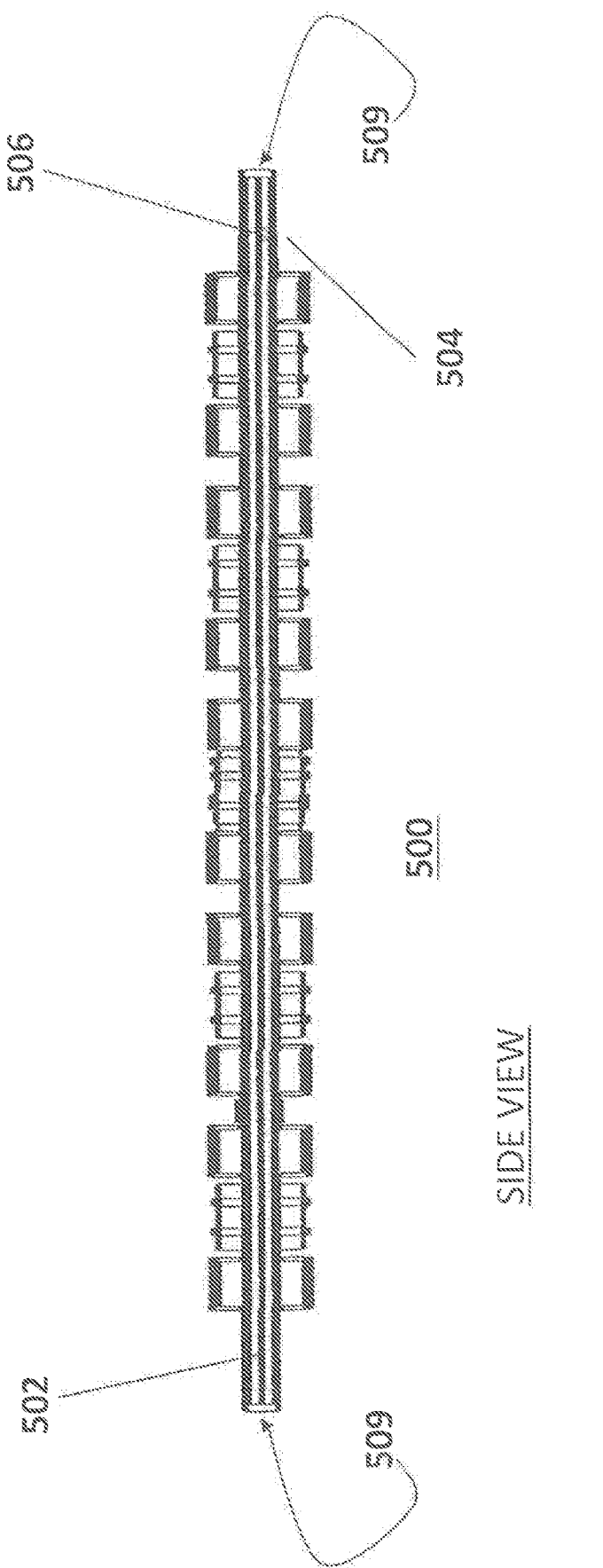

FIGS. 5A,5B illustrate an additional preferred embodiment that configures planar arrays 400 as a back-to-back three-dimensional (3D) resonant storage element array 500. Energy storage densities may be increased by grinding and chemically mechanically polishing the opposing major surface 475 of a planar array 502 (400) and its mirror image planar array 504 prior to applying an thin oxide layer 506 to the opposing major surface 475 of the planar array 502 and the mirror image planar array 504. The thin oxide layer 506 is an especially important feature when the substrates 102 comprise a carbide, nitride or MAX-phase material The thin oxide layer 506 applied on the back side of the planar array 502 and the mirror image planar array 504 is then used to bond these elements into the back-to-back 3D resonant storage device array 500. Bonding may be achieved in a variety of ways however oxide-oxide low-temperature direct bonding techniques commonly used in 3D wafer and chip integration is a preferred technique. Stacking planar arrays to mirror image planar arrays positions all of the external INPUT (OUTPUT) electrodes 404 and the external OUTPUT (INPUT) electrodes 408 to be co-located on the same side of the 3D resonant storage device to facilitate parallel electrical connections 509 between the planar array 502 and the mirror image planar array 504.

Figure 5C:
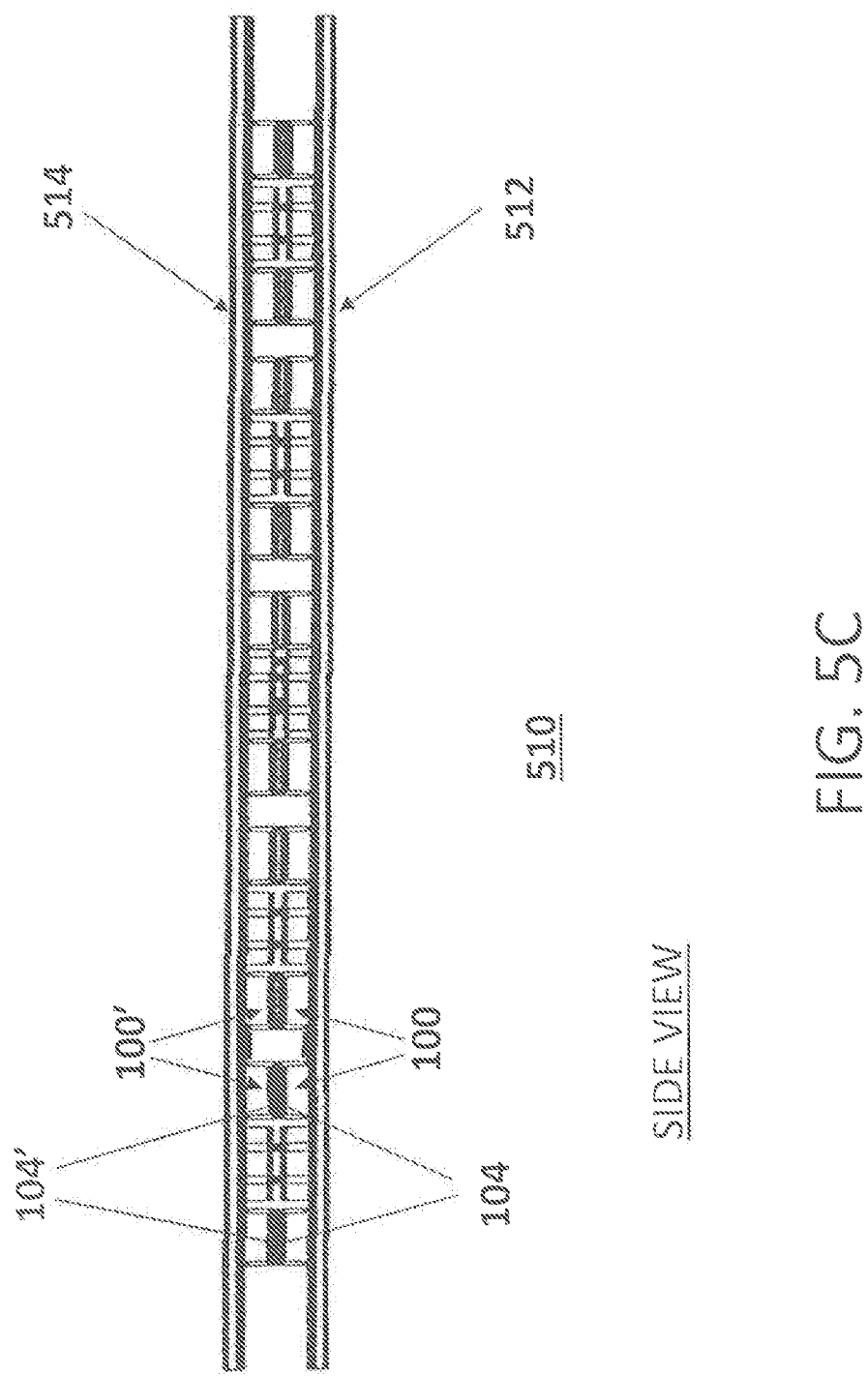

FIG. 5C illustrates a similar preferred embodiment that configures planar arrays 400 as a top-to-top three-dimensional (3D) resonant storage element array 510. The top-to-top 3D resonant storage element array 510 is constructed using metal-metal low temperature direct bonding techniques by aligning the primary electrode 104 at the top of each multilayer storage capacitor 100 in the planar array 512 with the primary electrode 104' each mirror image multilayer storage capacitor 100' in the mirror image planar array 514. It is preferred to apply amorphous silica insulation (not shown for visual clarity) to the surface of all conductive elements in the planar arrays 502,504,510,512 except in locations where the primary electrodes used for top-to-top bonding, to prevent electrical shorting between stacked arrays in all top-to-top 3D resonant storage device array 510

Figure 5E:
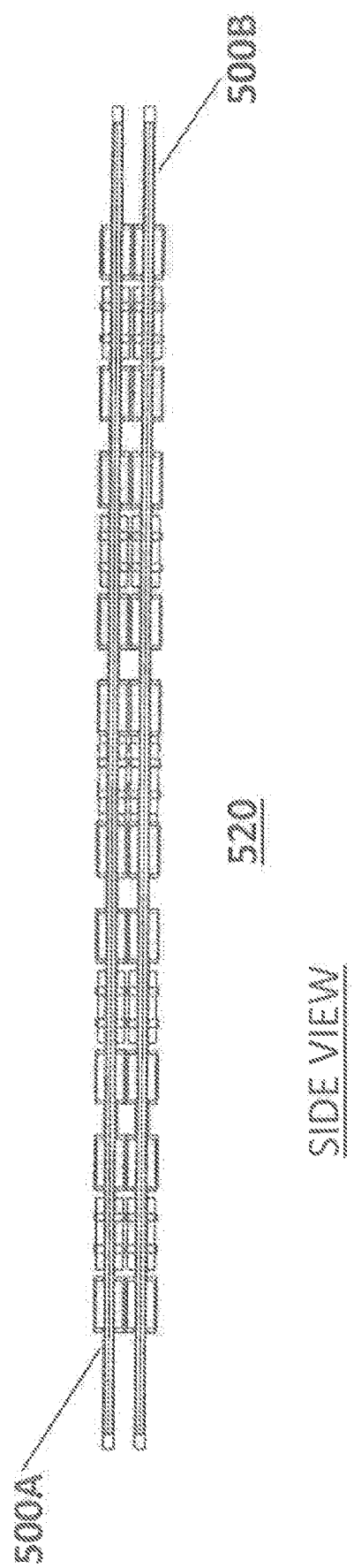

FIGS. 5D,5E, illustrate a generalized three-dimensional (3D) resonant storage device array 520 by bonding any number of back-to-back 3D resonant storage device arrays 500A,500B to produce a very large, small form factor capacitive storage device having a desired charge and discharge rate. The generalized 3D resonant storage device array 520 uses metal-metal low temperature and oxide-oxide low temperature direct bonding where appropriate and may include a single planar array 400 in the stack of arrays as shown in FIG. 6, or a be formed with one or more top-to-top 3D resonant storage device arrays 510 in the stack of planar arrays 500 or 510. The generalized 3D resonant storage device array 520 is assembled to present the external INPUT (OUTPUT) electrodes 522A,522B and the external OUTPUT (INPUT) electrodes 524A,524B on opposing sides of the stacked array. The external electrodes 522A,522B,524A, 524B may be configured to fit into slotted receptacles that electrically connect the external electrodes 522A,522B, 524A,524B in parallel or they may be electrically connected in parallel during the 3D assembly.

A generalized 3D resonant storage device that comprises N planar arrays configured in parallel will have capacitance, $C_{3D\ ARRAY}$, equal to:

$$C_{3D\ ARRAY} = \Sigma_i^N C_{PLANAR\ i} \quad (4e)$$

Figure 6A:
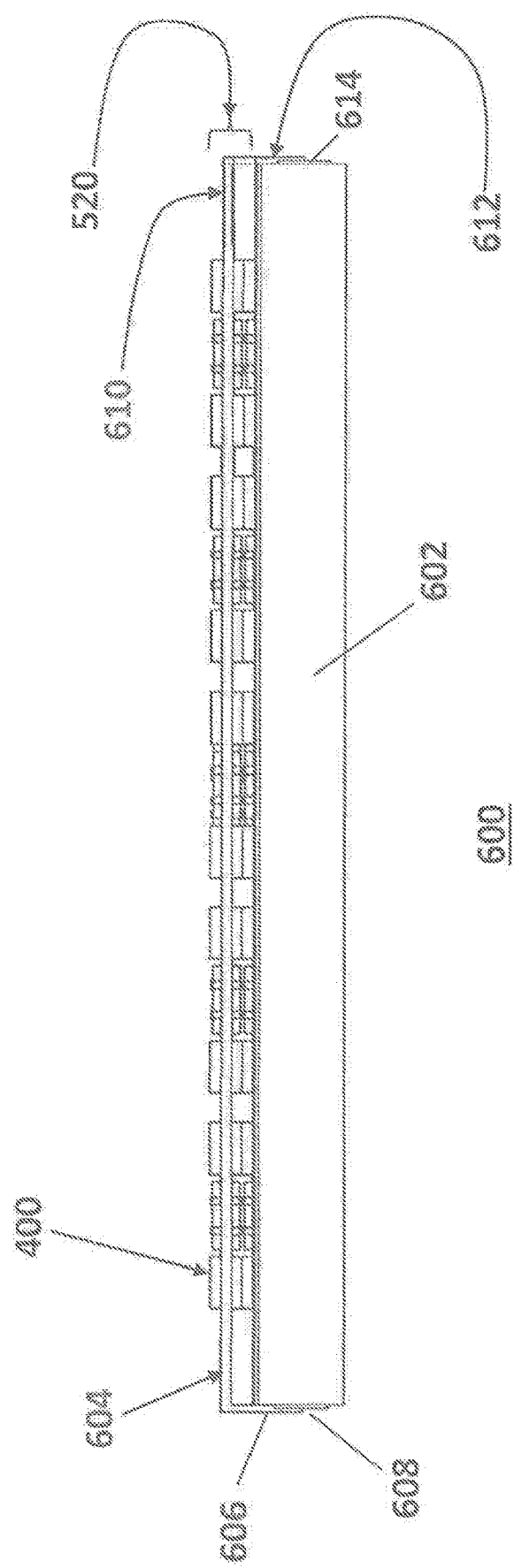
FIGS. 6A,6B depict a hybrid energy storage device that comprises a 3D array of resonant high energy storage devices electrically coupled to an electrochemical battery.
Figure 6B:
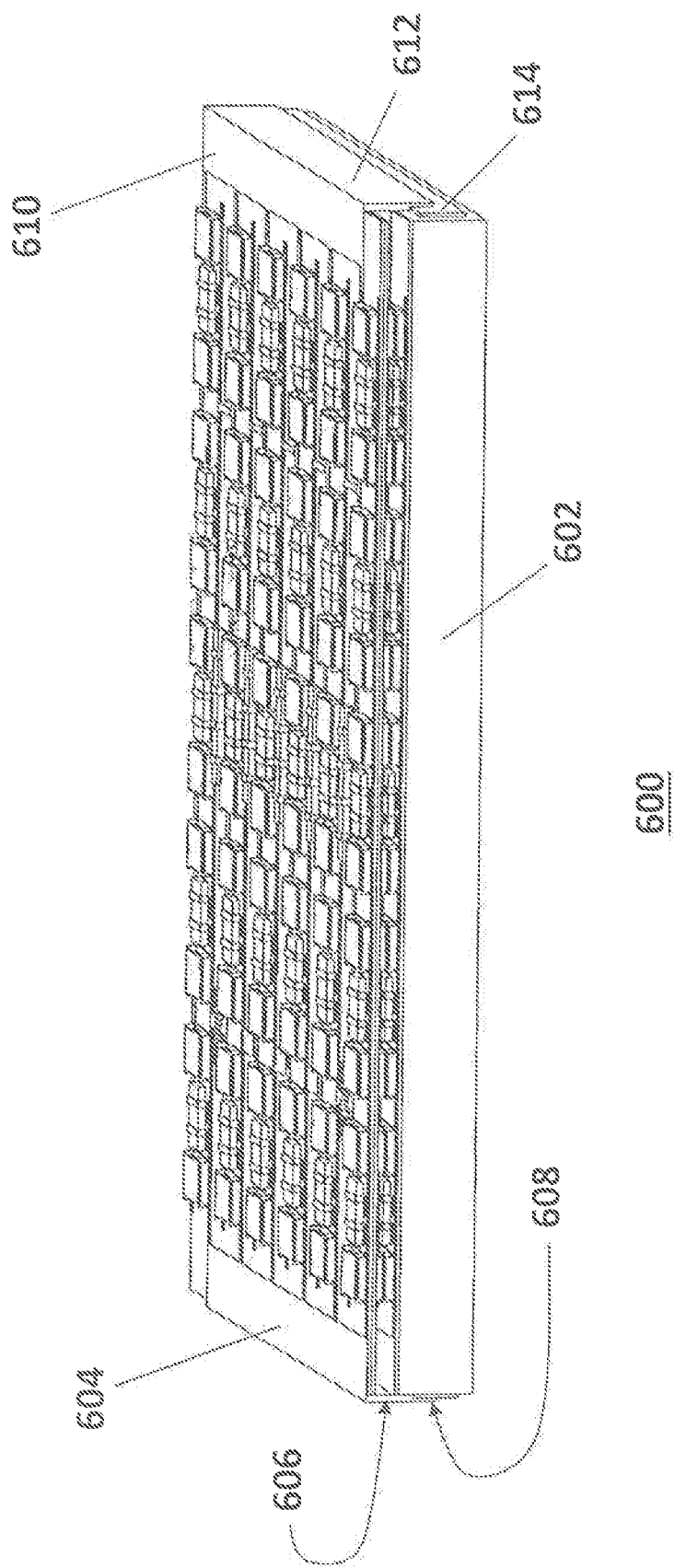

FIGS. 6A,6B illustrate a final preferred embodiment of the invention forms a hybrid energy storage system 600 that disposes at least one planar array 400 configured individually or assembled within a generalized 3D resonant storage device array 520 in proximity to an electrochemical energy storage system or battery 602. The hybrid energy storage system 600 would resolve the problem with excessively long charging times, which has become a major deficiency in the marketability of electric vehicle ("EV") systems. In situations where the EV operator has insufficient time to fully charge the battery, the hybrid energy storage system 600 would the EV operator to generate a "quick charge" in the capacitor portion 520 of the hybrid energy storage that could be used to power the vehicle over short distances needed to reach a destination that would conveniently permit longer charging times, while continuing charge the larger battery system 602. The external INPUT electrodes 604 of the at least one planar array 400 or generalized 3D resonant storage device array 520 are placed in electrical communication 606 with its corresponding polarity battery terminal 608. The external OUTPUT electrodes 610 of the at least one planar array 400 or generalized 3D resonant storage device array 520 are placed in electrical communication 612 with opposing battery terminal 614.

What is claimed:

1. A high energy density dielectric layer that polarizes and de-polarizes on femto-second ($10^{-15}$ second) time scales comprising:
    a theoretically dense perovskite electroceramic further comprising a polycrystalline network of uniformly distributed grains having uniform grain size less than or equal to 50 nm, and,
    an intra-granular crystalline lattice that has an average atomic mass unit (amu) greater than or equal to 25 amu.

2. The high energy density dielectric layer as in claim 1, wherein the intra-granular crystalline lattice has an average atomic mass unit (amu) greater than or equal to 50 amu.

3. The high energy density dielectric layer as in claim 1 that is compositionally complex.

4. The high energy density dielectric layer as in claim 3 that comprises:
    transition metal elements from the group consisting of: scandium (Sc), titanium (Ti), vanadium (V), chromium (Cr), manganese (Mn), zinc (Zn), yttrium (Y), zirconium (Zr), niobium (Nb), molybdenum (Mo), hafnium (Hf), tantalum (Ta), and tungsten (W).

5. The high energy density dielectric layer as in claim 4 that further comprises:
    lanthanide metal elements from the group consisting of: lanthanum (La), cerium (Ce), praseodymium (Pr), neodymium (Nd), samarium (Sm), europium (Eu), gadolinium (Gd), terbium (Tb), dysprosium (Dy), holmium (Ho), and ytterbium (Yb).

6. The perovskite ceramic as in claim 1 further comprising post transition metal elements from the group consisting of: indium (In), tin (Sn), lead (Pb), and bismuth (Bi).

7. The high energy density dielectric layer as in claim 1, wherein the high energy dielectric layer has a relative permittivity, $\varepsilon_R$, greater than 200.

8. The high energy density dielectric layer as in claim 1, wherein the theoretically dense polycrystalline network of uniformly distributed grains further comprises a grain boundary material that consists essentially of highly electrically insulating metal oxide phases formed with silicon dioxide.

9. The high energy density dielectric layer as in claim 8 wherein the grain boundary material consists essentially of silicon dioxide without any additional metal oxide phases.

10. The high energy density dielectric layer as in claim 1 that has a thickness greater than 1 nm.

11. The high energy density dielectric layer as in claim 1 that is formed on a conductive element.

12. A method of forming a high energy density dielectric layer by incorporating into a theoretically dense perovskite electroceramic a polycrystalline network of uniformly distributed grains having uniform grain size equal to or less than or equal to 50 nm and an intra-granular crystalline lattice that has an average atomic mass (amu) greater than or equal to 25 nm.

13. The method of claim 12 further comprising incorporation of higher amu elements into the said theoretically dense perovskite electroceramics.

14. The method of claim 13 wherein said incorporated amu elements comprise three or more metal oxide components.

\* \* \* \* \*